United States Patent [19]

Kyle

[11] 4,186,342
[45] Jan. 29, 1980

[54] MARINE RADIO TELEPHONE

[75] Inventor: Robert R. Kyle, Plano, Tex.

[73] Assignee: Texas Instruments Incorporated, Dallas, Tex.

[21] Appl. No.: 848,559

[22] Filed: Nov. 4, 1977

[51] Int. Cl.$^2$ .......................... H03B 3/08; H04B 1/40
[52] U.S. Cl. ..................................... 325/17; 331/1 A
[58] Field of Search ....................... 325/15, 17, 18, 19, 325/20, 25, 184, 419, 421, 464; 343/175, 181; 364/715; 340/711; 235/61 PB; 331/1 A, 18, 19

[56] References Cited

U.S. PATENT DOCUMENTS

| | | | |
|---|---|---|---|
| 4,013,957 | 3/1977 | Tojo | 325/25 |
| 4,092,594 | 5/1978 | Baker | 325/25 |

Primary Examiner—Benedict V. Safourek
Attorney, Agent, or Firm—Rene' Grossman; James T. Comfort; Alva H. Bandy

[57] ABSTRACT

An improved marine radio telephone is disclosed which has a housing having an angular opening suitable for either above or below eye level installation and a chassis having printed wiring board support members including a tiltable front panel support member for adapting the front panel to correspond to the position of the housing when mounted therein and a rear support member for supporting the transmitter board and heat sink for improved heat dissipation. The front panel includes a keyboard having keys for selecting digits 0 to 9, an emergency channel, and weather channels, a display for displaying the channel selected, control knobs for volume and squelch control, and switches for power and U.S.A. or international channel selection. The printed wiring boards include a front panel board, a digital input/output and power board, a frequency synthesizer board, a receiver board and a transmitter board. The front panel board sends operating signals to and receives outputs from the other boards. The digital input/output board includes a digital detector means for producing binary coded numbers representative of the keys pressed, a load control means for alternately loading the binary coded numbers into a tens register and a units register, an illegal channel detector connected to the tens and units registers for detecting an improper channel selection, and a memory connected to the units register and producing in response to binary coded numbers for legal channels a synthesizer address code for the channel selected. The synethesizer board is connected to the digital input/output and power board to provide, in response to the synthesizer address code, a local oscillator signal for the receiver clearing receiver operation and an audio modulated signal for transmission during transmitter operation. A phase lock loss signal is produced for preventing illegal operation. The receiver board includes an improved squelch circuit which provides for fine tuning to eliminate noise without unnecessarily reducing the audio signal.

9 Claims, 31 Drawing Figures

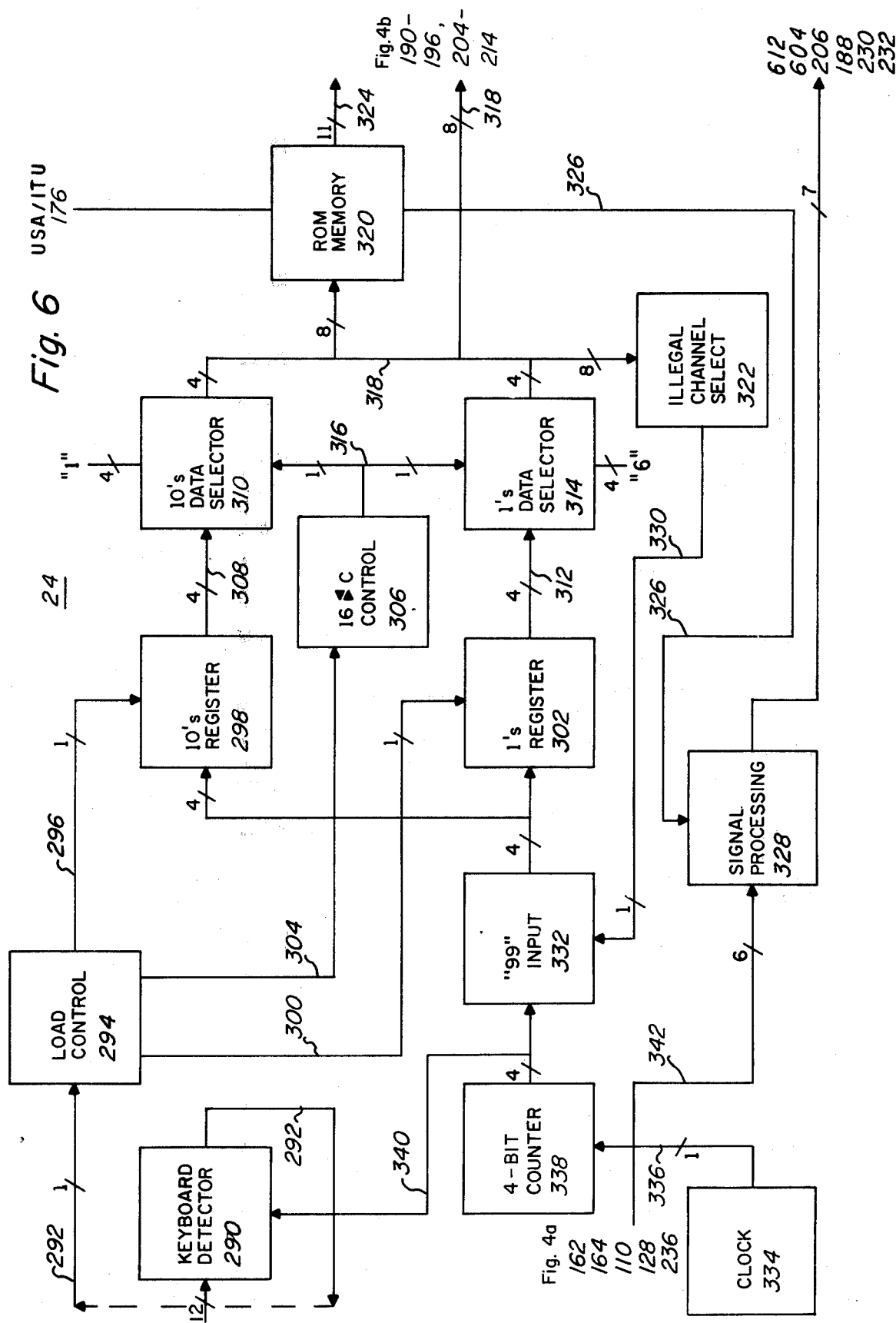

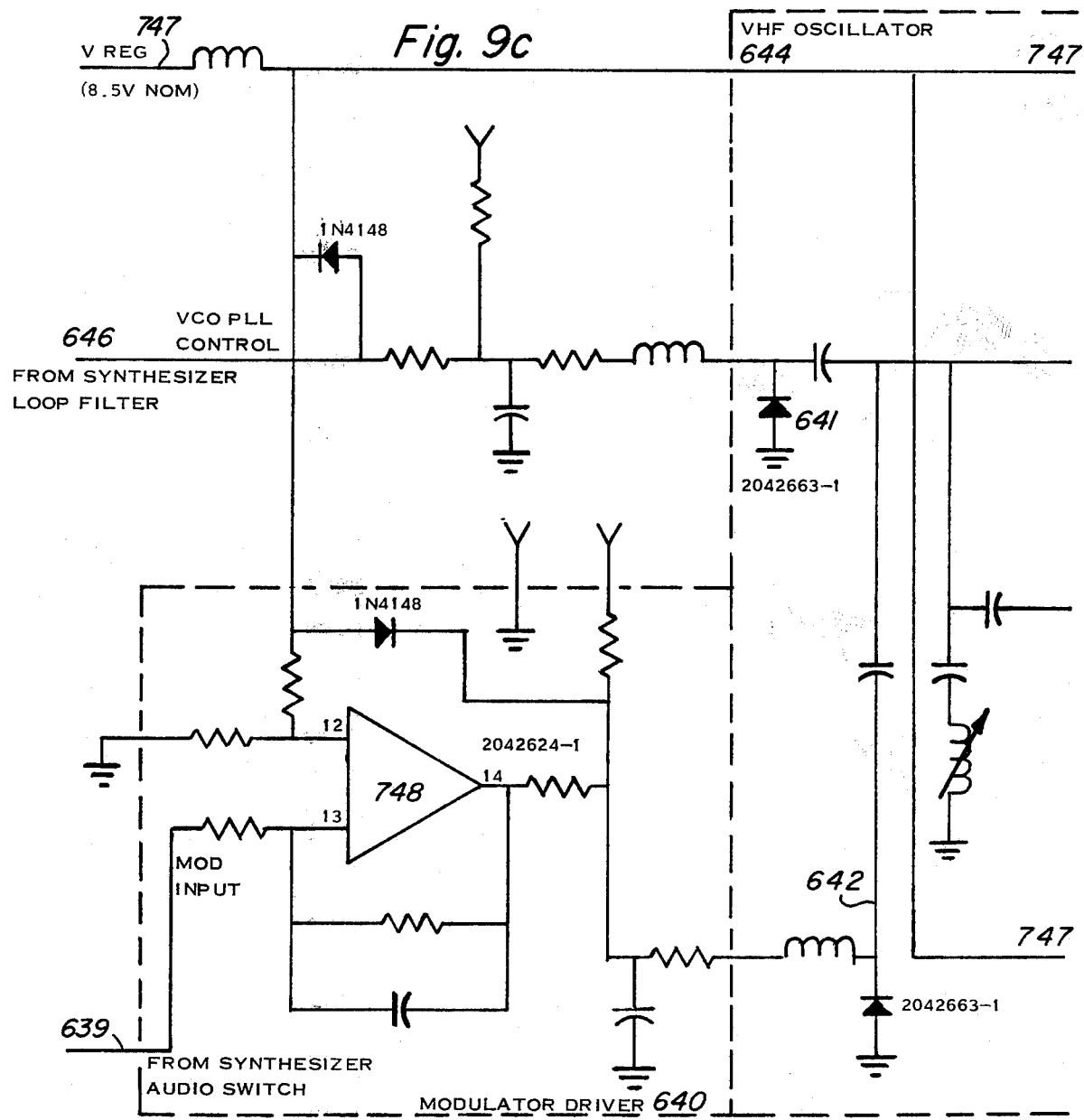

MARINE RADIO TELEPHONE

This invention relates to transceivers and more particularly to an improved solid state, digital VHF marine band radio telephone.

In the past VHF radio telephones such as, for example, the fully synthesized radio telephone sold under the trademark "KONEL KR 78", have had fixed angle display panels with channel select programmable push buttons for instant access to a limited number of channels. Other channels are selected by manipulating selector dials. The transceivers have included transmitter, receiver, synthesizer, and control circuits on printed circuit boards and have featured field effect transistor receivers and transmitters, crystal filters, dual conversion, and d.c. controlled volume squelch. Internal programming to prevent illegal transmission on receive-only channels has been used. Nevertheless, transceivers having these features have intricate, complex circuits, which are too difficult to manufacture and operate, too heavy and bulky for use in, for example, aircraft, and are too expensive for noncommercial use.

Accordingly, it is an object of this invention to provide a lightweight transceiver which is easy to fabricate, inexpensive, and simple to operate.

Another object of the invention is to provide a transceiver which may be positioned above or below an operator's eye level with the front display panel tilted substantially normal to the operator's line-of-sight to the panel for easy viewing.

Still another object of the invention is to provide a transceiver which is simple to operate and which insures proper operation of the system through visible signal indicators.

A further object of the invention is to provide a transceiver having an improved frequency synthesizer.

Briefly stated the invention comprises a transceiver or radio telephone having a case with a preselected angular opening and a chassis supporting a front display panel and printed wiring boards including a front panel PWB, a digital and power supply PWB, a synthesizer and receiver PWB and a transmitter PWB. The transceiver may be mounted in any position, either horizontally or vertically. It has a tiltable front display panel for underhead or overhead mounting, for example, the transceiver can be slid out of the case, the case turned over, the front panel tilted downwardly, and slid back into the case for easy viewing when the unit is mounted overhead.

The front display panel holds the display and unit controls. The display is a two element alphanumeric digital display; each element has a decimal point. The two display elements show the channel selected and the decimal points are used to remind the operator of such things as the selection of a receive only channel selection. The controls include a volume with ON-OFF switch, a U.S.A/ITU selector switch, a 25 w/1 w/PA switch, a squelch control knob, and a keyboard. The keyboard is preferably a 12 key calculator type keyboard. The 12 keys consist of keys for the digits "0" thru "9", a key (16 C) for the emergency channel and a key (SEL) for selecting a weather station.

The operation of the unit is facilitated by features which include the automatic tuning of the unit to channel "16" when first turned on and displaying channel "16" to indicate visually that the emergency channel has been selected for monitoring. Selection of the PA switch position permits the use of a PA speaker; a jack is provided in the casing for connecting the PA speaker to the unit. When nonemergency calls are to be made, a two way channel is selected with the ten's digit entered first and then the unit digit. After selecting the first digit of a channel or upon completion of a transmission, reversion to channel "16" is made by pressing the "16 C" key; by pressing the "16 C" key again the unit returns to the previously selected channel.

As the weather channels do not have a two digit number to identify them, a weather station is selected by pressing the "SEL" key and then a 1, or 2, or 3 for the desired weather station. Only a single digit is displayed on the unit display, the tens display is blanked and the unit's decimal point display is flashing on and off to indicate a receive only station. The blanked tens display distinguishes a weather station from a corresponding 1, or 2, or 3 channel which have a "0" displayed in the tens display.

When a nonassigned channel number is entered on the keyboard the display will flash the number "99" on and off until a legal channel is selected.

The unit has other features designed to aid the operator in the legal operation of the unit. For example, if the units' synthesizer looses phase lock, and thus would not generate the correct frequency, two things happen. First, both the transmitter and receiver are inhibited and the unit will not receive or transmit; and secondly, the tens decimal on the display will flash on and off to indicate that the synthesizer has lost phase-lock.

When the microphone is replaced in its hang-up bracket, the unit automatically converts to channel "16" regardless of what channel was selected previously. This will provide for channel "16" monitoring without the operator having to switch back to it after completing a transmission on a working channel. Of course, it is possible to select any other channel by means of the keyboard entry, or to return to the previously selected channel by means of the "16" key while the microphone is hung-up.

The novel features believed to be characteristic of the invention are set forth in the appended claims.

The invention itself, however, as well as the above-mentioned features and other objects and advantages thereof may best be understood by reference to the following detailed description of an illustrative embodiment when read in conjunction with the accompanying drawings in which:

FIG. 6 is a block diagram of the digital input/output printed wiring board;

FIG. 9a–9i are schematics of the synthesizer printed wiring board;

Figure 1:
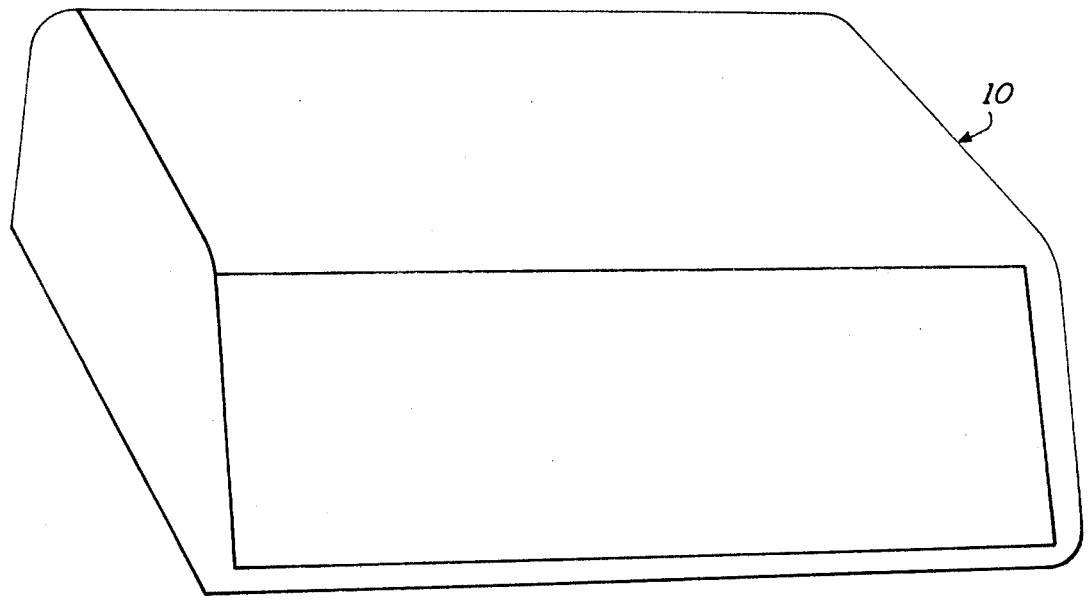
FIG. 1 is an isometric view of the transceiver's case
Figure 2:
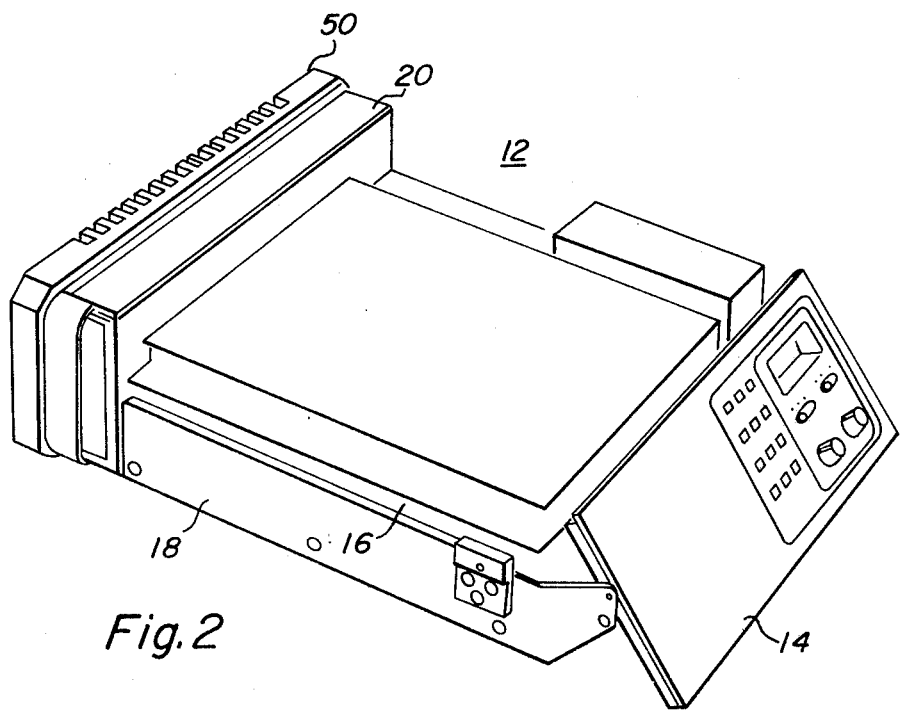
FIG. 2 is an isometric view of the transceiver's chassis for supporting the printed wiring boards.

Referring now to the Figures, the radio telephone or transceiver comprises a housing or case 10 (FIG. 1) into which a chassis 12 (FIG. 2) is inserted. The housing 10 is made of a suitable fire resistant, weatherproof, high-impact plastic such as, for example, an acrylic, butadiene, styrene plastic sold by Borg Warner Chemicals, Inc. under the trademark Cycolac KJB-2.

The chassis 12 comprises a front panel 14 and a base member 16 supporting side walls 18 and a rear wall 20. The side walls 18 have tappered front ends forming ears to which the front panel 14 can be attached at an angle preferrably about 37°. Thus, the housing 10 can be positioned below the operator's line-of-sight and the chassis inserted with the front panel substantially normal to the operator's line-of-sight or the housing can be turned over for positioning above the operator's line-of-sight and the chassis inserted with the front panel attached normal to the operator's line-of-sight.

The chassis 12 supports a panel printed wiring board (PWB) 22 (FIG. 3), a digital I/O (input/output)/power supply PWB 24, a receiver/synthesizer PWB 26 and a transmitter PWB 28. If a remote unit is used, a selector PWB 30 is provided for a remote unit 32. The panel printed wiring board 22 is attached to the front panel 14 (FIG. 2) and supports a speaker 36 (FIG. 3), an on/off/volume knob 38, a squelch knob 40, a 25 w(watt)/1 w/PA (public address) select switch 42, a U.S.A./ITU select switch 44, and a display 46. A keyboard 48 is connected to the front panel 14. The digital I/O/power supply PWB 24 is attached to one major surface of the base member 16 (FIG. 2) and the receiver/synthesizer PWB 26 (FIG. 3) is attached to the other major surface of the base member. The transmitter PWB 28 is attached to a heat sink 50 (FIG. 2) which is attached to the rear wall 20. The front plate and heat sink are, for example, aluminum castings and the chassis base member, side walls and end wall are, for example of plate aluminum.

FRONT PANEL PWB

The on/off/volume control knob 38 (FIG. 3) is connected to an on/off switch 52 (FIG. 4a) and arm of volume control potentiometer 54. The on/off switch 52 has its pole terminal 56 (FIG. 4a) connected to a d.c. source of power which may be, for example, a +13.8 v battery and to ground at terminal 58.

Figure 10:
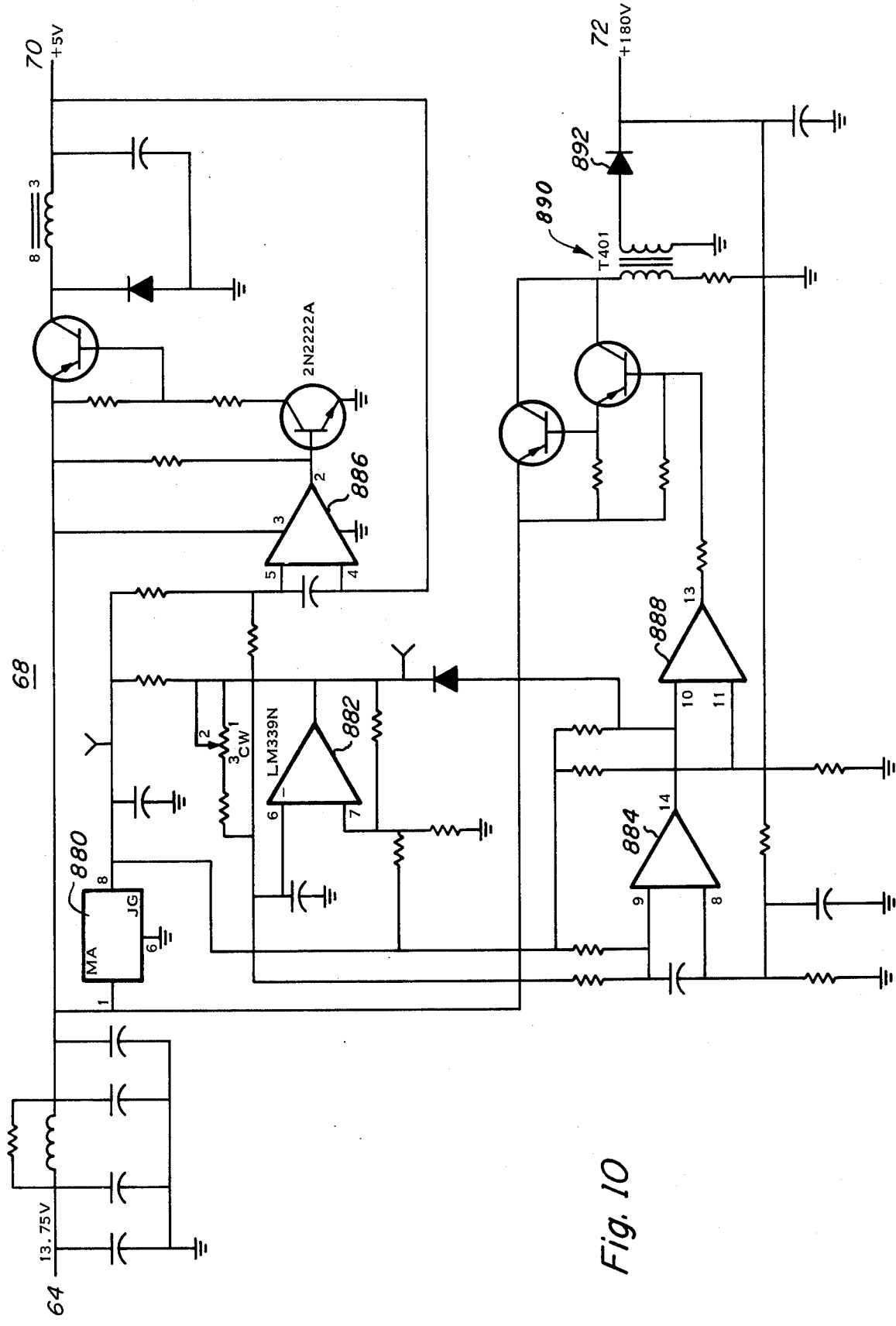
FIG. 10 is a schematic of the power supply.

The power is supplied through switch 52 to the following panel PWB 22 terminals: terminal 62 to the receiver/synthesizer PWB 26; terminal 64 to the digital I/O/power supply PWB 24; and terminal 66 to the transmitter PWB 28. The power supply unit 68 (FIG. 10) of the digital I/O/power supply PWB 24 returns a logic voltage (5 v) and a display voltage (180 v), respectively, through terminals 70 and 72 (FIG. 4b) of the panel PWB 22. The resistor 74 (FIG. 4a) of the volume control potentiometer 54 has one end connected to the high volume control output terminal 76 leading to the receiver of the receiver/synthesizer board 26 and its other end connected to volume control return terminal 78. The arm of the volume control potentiometer 54 is connected by lead 55 to the volume control terminal 80 of the receiver/synthesizer PWB 26.

Figure 3:
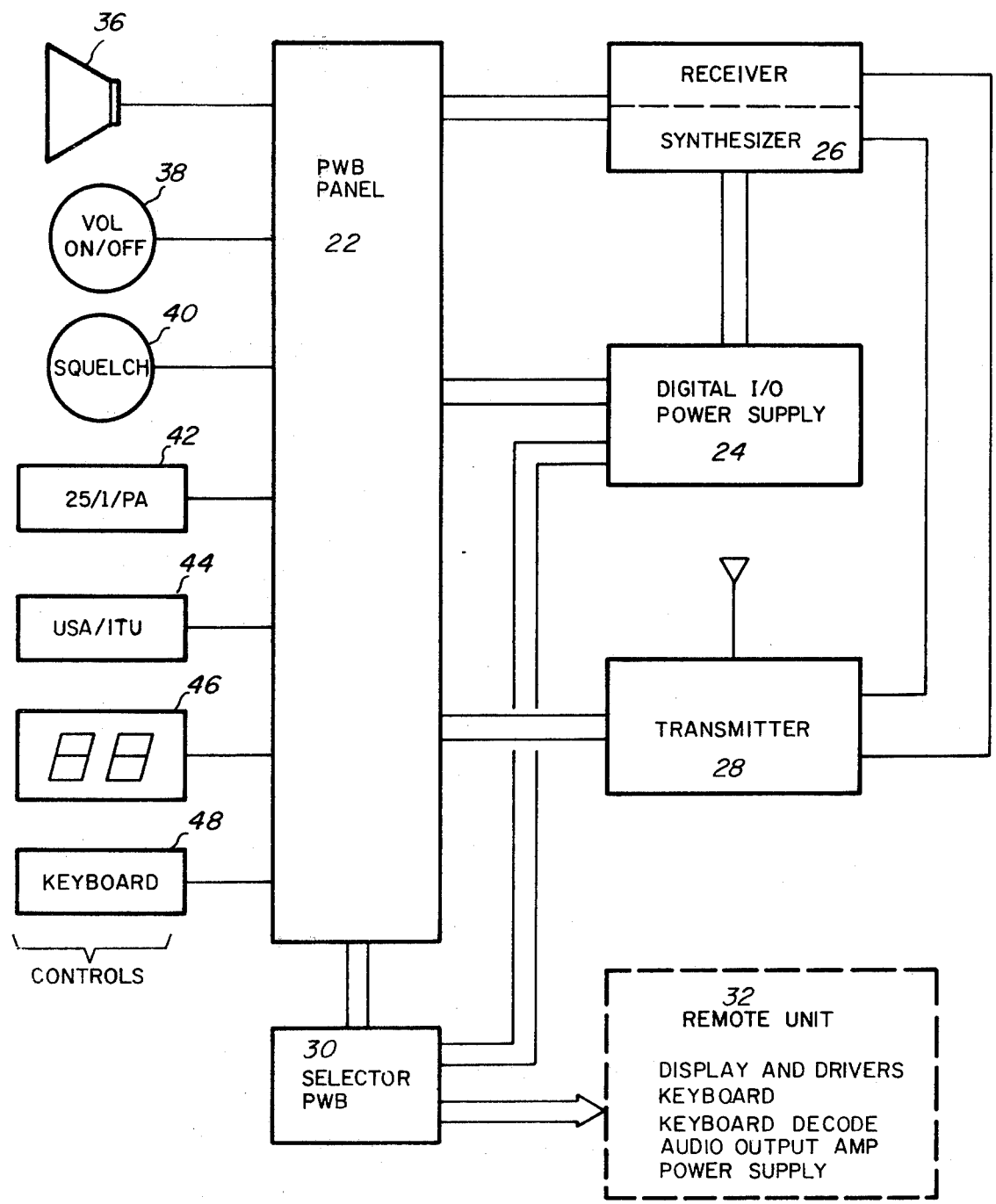
FIG. 3 is a block diagram of the transceiver's elements.
Figure 4A:
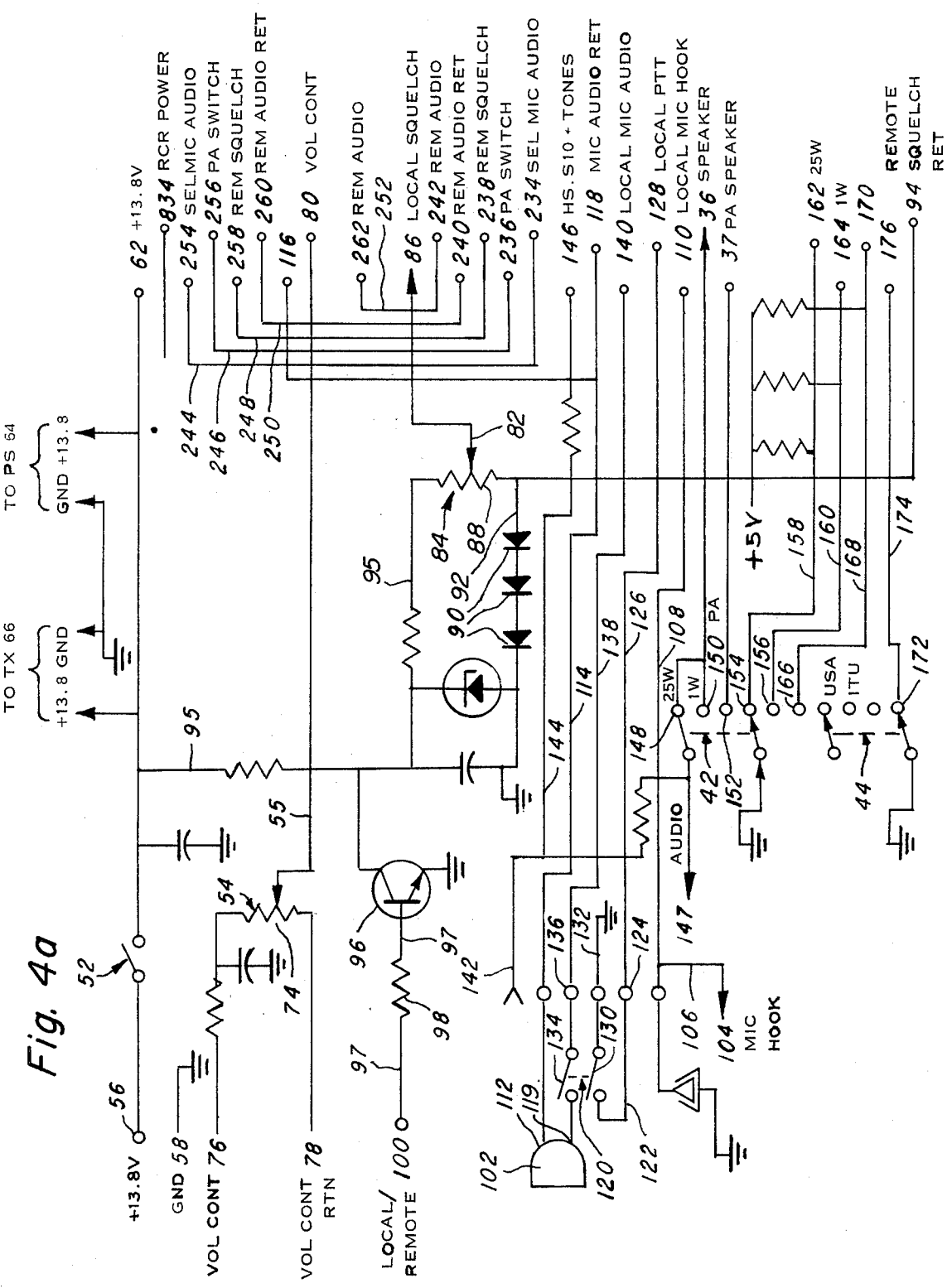
FIGS. 4a–4b are schematics of the front panel printed wiring board.

The squelch control knob 40 (FIG. 3) is connected to the arm 82 of potentiometer 84 (FIG. 4a). The arm 82 is connected to the squelch terminal 86 of the receiver of the receiver/synthesizer PWB 26. The squelch potentiometer resistor 88 has one end connected by lead 92 to the junction of a plurality of power dropping diodes 90 connected in series to ground and to a remote squelch return terminal 94. The other end of the squelch potentiometer resistor 88 is connected by lead 94 to the junction of the power source and collector of a switching transistor 96. The base of transistor 96 is connected by lead 97 through a biasing resistor 98 to the local/remote squelch selector terminal 100 leading to the digital I/O/power supply PWB 24.

A microphone 102 (FIG. 4a) is hooked onto a hook 104. Hook 104 is connected by lead 106 to input of the panel PWB 22 and by lead 108 to local microphone hook terminal 110 (FIG. 4a) of the digital I/O/power supply PWB 24. The microphone 102 is enabled by its removal from the hook. One terminal 112 of the microphone is connected by lead 114 to microphone audio return terminals 116 and 118 of the receiver/synthesizer PWB 26 and digital I/O/power supply PWB 24, respectively. The other terminal 119 of microphone 102 is connected to a contact of a double pole switch 120; the other contact of the double pole switch is connected by lead 122 to panel PWB input terminal 124. Input terminal 126 is connected by lead 126 to panel PWB push-to-talk terminal 128 (FIG. 4a) leading to digital I/O/power supply/PWB 24. Pole 130 of the double pole switch 120 is connected to ground through panel PWB input terminal 132 to enable the remote push-to-talk circuit; the other pole 134 is connected to panel PWB input terminal 136. Panel input terminal 136 is connected by lead 138 to local microphone audio terminal 140 (FIG. 4a) of the digital I/O/power supply PWB 24. A panel PWB 22 input terminal 142 (FIG. 4a) is available to connect by lead 144 a handset, if used, to the junction of a handset side tone terminal 146 of the synthesizer of the receiver/synthesizer PWB 26, and audio input side 147 of the 25 w or 1 w speaker or PA speaker switch 42. The terminal is required to connect the handset to the audio input in order for the operator of the handset to hear replies.

The 25 w/1 w/PA switch 42 is a toggle switch (FIG. 3); one side of the switch 42 (FIG. 4a) has its 25 w and 1 w contacts 148 and 150, respectively, connected to the internal speaker 36 and contact 152 connected to the PA speaker 37 (not shown). Contacts 154 and 156, which correspond to speaker contacts 148 and 150, are connected, respectively, by leads 158 and 160 to 25 w and 1 w terminals 162 and 164 leading to the digital I/O/power supply PWB 24; while contact 166, which corresponds to PA contact 152, is connected by lead 168 to terminal 170 leading to the digital I/O/power supply PWB.

The U.S.A./ITU switch 44 (FIG. 3) is a toggle switch used to switch the set from U.S.A. designated channel frequencies to international channel frequencies. The set is normally on U.S.A. channel frequencies; thus, it is switched to the ITU contact for ITU channel frequencies. The ITU contact 172 (FIG. 4a) is connected by lead 174 to the U.S.A./ITU panel PWB terminal 176 leading to digital I/O/power supply PWB 24.

DISPLAY

The display 46 (FIG. 3) comprises a pair of gaseous discharge type display elements 178 and 180 (FIG. 4b) such as, for example, DS 101's manufactured by Beckman Instruments.

The display elements 178 and 180 are seven segment displays with decimal points 216 and 218. The display elements 178 and 180 are connected by lead 182 to the 180 v input terminal 72. Display element 178 is the unit display whose seven segments are driven by the a-g outputs (PINS 13, 12, 11, 10, 9, 15 and 14) of driver 184 which may be, for example, an SN 7548. The drivers blanker/ripple blanking output (PIN 4), is connected by lead 186 to units blanker terminal 188 leading to the digital I/O/power supply PWB 24. The driver's input terminals A, B, C, D (PINS 7, 1, 2, and 6) are connected, respectively, by leads 190', 192', 194', and 196', to digital I/O/power supply PWB units A, B, C, D terminals 190, 192, 194, and 196 and CPI (PIN 3) is connected by lead 202 with the CPI PINS (3 PINS) of drivers 198 and 200 to the 5 v panel PWB terminal 70.

Display 180 is the tens display whose seven segments are driven by the a-g outputs of driver 198. The tens driver's ripple blanking output (PIN 4) is connected by lead 204 to the tens blanker terminal 206 leading to the digital I/O/power supply PWB 24. The tens driver's inputs (PINS A, B, C, D) are connected to the tens output terminals by leads 208, 210, 212, and 214 of the digital I/O/power supply PWB. The decimal point indicators 216 and 218 of display elements 178 and 180 (PINS B8 and A8) are connected, respectively, by leads 220 and 222 to the output PINS e and g of driver 200. The input PIN A of driver 200 is connected by lead 224 to the output of a NAND gate 228 which is connected to the digital I/O/power supply PWB 24 lock loss indicate terminal 230 and input PIN B is connected by lead 226 to transmit indicate terminal 232 leading to the digital I/O/power supply PWB 24. For operation by a remote unit, the front panel PWB 22 (FIG. 4a) has a select microphone audio terminal 254, PA switch terminal 256, remote squelch terminal 258, a remote audio return terminal 260, and remote audio terminal 262 leading to the receiver/synthesizer PWB 26 connected, respectively, by leads 244, 246, 248, 250 and 252 to corresponding front panel PWB terminals 234, 236, 238, 240, and 242 leading to digital I/O/power supply PWB 24.

KEYBOARD

Figure 5A:
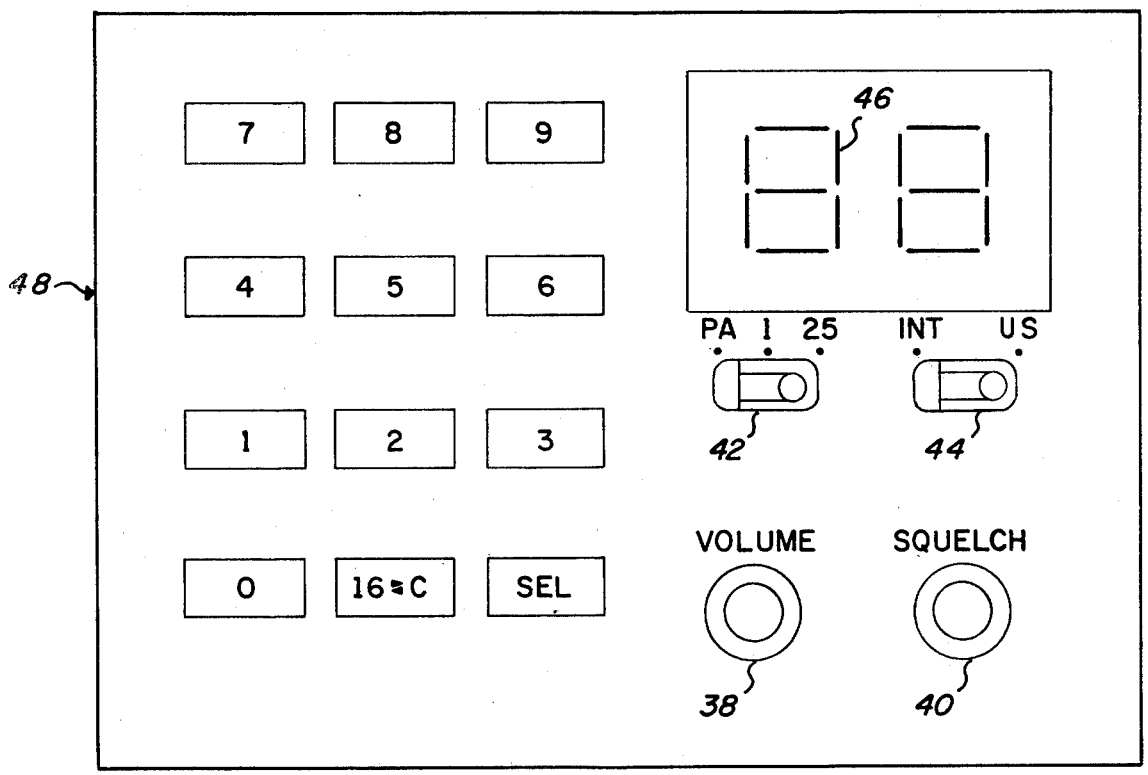
FIGS. 5a–5b are, respectively, a plan view of the keyboard and a schematic of the keyboard circuits.
Figure 5B:
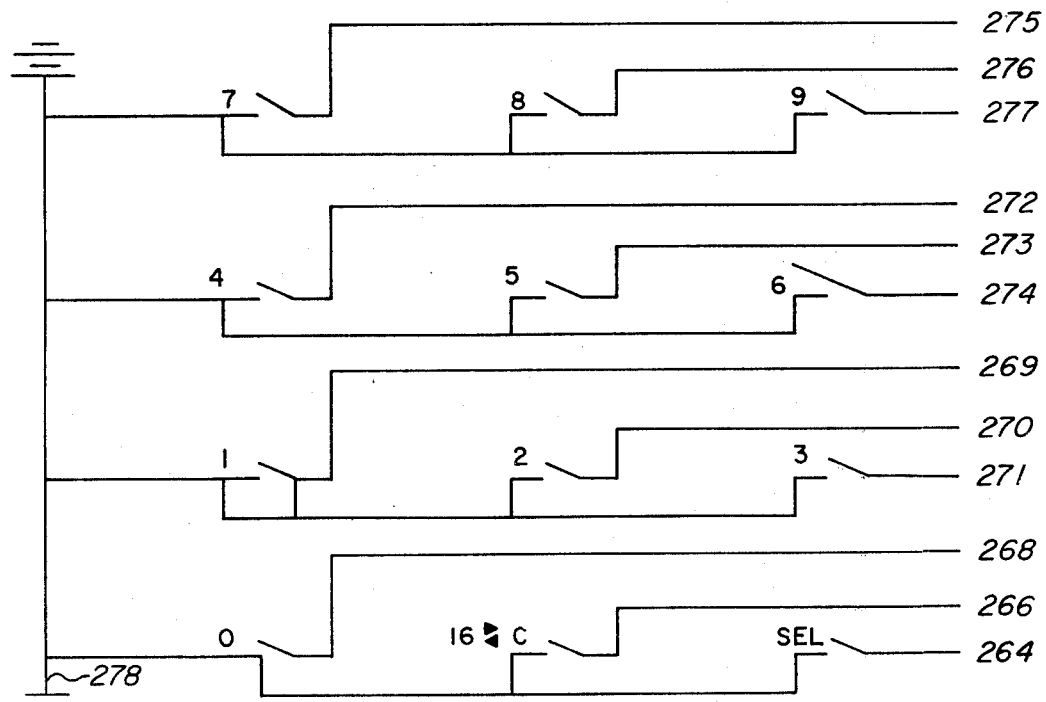

Referring now to FIGS. 5a and 5b, the keyboard is a calculator type keyboard mounted in the front panel 14 (FIG. 3). The keyboard 48 (FIG. 5a) has ten digit keys "0 through 9", a channel "16∅ C" key, and a select "SEL" key. The keyboard keys are switches (FIG. 5b) electrically connected to the digital I/O/power supply PWB 24 as follows: "SEL" by lead 264, "16-C" by lead 266, and digits "0 through 9" by leads 268–277. The keyboard is grounded by lead 278.

DIGITAL INPUT/OUTPUT PWB

Referring to FIG. 6, the digital I/O/power supply PWB 24 comprises a keyboard detector 290 connected to the twelve keyboard lines (FIG. 5b). The output of the keyboard detector is connected by line 292 to a load control 294. The load control 294 is connected by: line 296 to a tens register 298, by line 300 to a units register 302, and by line 304 to a channel "16-C" control 306. The tens register 298 is connected by lines 308 to a tens data selector 310, and the units register 302 is connected by lines 312 to a units data selector 314. The ∓16-C" key control 306 is connected by line 316 to the tens and units data selectors 310 and 314. The tens and units data selectors 310 and 314 are connected by lines 318: to a ROM or PROM memory 320; to an illegal channel detector 322, and to terminals 190–196, 208–214 (FIG. 4b) of the channel display element 178 and 180. The ROM memory 320 also receives an U.S.A./ITU channel select signal from front panel PWB 22 terminal 176 (FIG. 4a). The ROM 320 provides, on lines 324, 12 bit words in accordance with the software program of TABLE 1 to the frequency synthesizer of the receiver/synthesizer PWB 26 and a receive only signal on line 326 to a signal processor 328.

TABLE I

| | SYNTHESIZER ADDRESS CODES | | | | | | | |
|---|---|---|---|---|---|---|---|---|
| | USA CODES | | | | ITU CODES | | | |
| | TRANSMIT | | RECEIVE | | TRANSMIT | | RECEIVE | |
| CH | n1 | n2 | n1 | n2 | n1 | n2 | n1 | n2 |
| 1 | 1010100 | 0110 | 1010100 | 0110 | 0010001 | 1000 | 1010100 | 0110 |
| 2 | 1010100 | 0100 | 1010100 | 0100 | 0010001 | 0110 | 1010100 | 0100 |
| 3 | 1010100 | 0010 | 1010100 | 0010 | 0010001 | 0100 | 1010100 | 0010 |
| 4 | 1010011 | 1010 | 1010011 | 1010 | 0010001 | 0010 | 1010011 | 1010 |
| 5 | 1010011 | 1000 | 1010011 | 1000 | 0010000 | 1010 | 1010011 | 1000 |
| 6 | 0010000 | 1000 | 1100101 | 1010 | 0010000 | 1000 | 1100101 | 1010 |
| 7 | 0010000 | 0110 | 1100101 | 1000 | 0010000 | 0110 | 1010011 | 0100 |
| 8 | 0010000 | 0100 | 1100101 | 0110 | 0010000 | 0100 | 1100101 | 0110 |
| 9 | 0010000 | 0010 | 1100101 | 0100 | 0010000 | 0010 | 1100101 | 0100 |
| 10 | 0001111 | 1010 | 1100101 | 0010 | 0001111 | 1010 | 1100101 | 0010 |
| 11 | 0001111 | 1000 | 1100100 | 1010 | 0001111 | 1000 | 1100100 | 1010 |
| 12 | 0001111 | 0110 | 1100100 | 1000 | 0001111 | 0110 | 1100100 | 1000 |
| 13 | 0001111 | 0100 | 1100100 | 0110 | 0001111 | 0100 | 1100100 | 0110 |
| 14 | 0001111 | 0010 | 1100100 | 0100 | 0001111 | 0010 | 1100100 | 0100 |
| 15 | 1100100 | 0010 | 1100100 | 0010 | 0001110 | 1010 | 1100100 | 0010 |
| 16 | 0001110 | 1000 | 1100011 | 1010 | 0001110 | 1000 | 1100011 | 1010 |
| 17 | 0001110 | 0110 | 1100011 | 1000 | 0001110 | 0110 | 1100011 | 1000 |
| 18 | 0001110 | 0100 | 1100011 | 0110 | 0001110 | 0100 | 1010001 | 0010 |
| 19 | 0001110 | 0010 | 1100011 | 0100 | 0001110 | 0010 | 1010000 | 1010 |
| 20 | 0001101 | 1010 | 1010000 | 1000 | 0001101 | 1010 | 1010000 | 1000 |
| 21 | 1100010 | 1010 | 1100010 | 1010 | 0001101 | 1000 | 1010000 | 0110 |
| 22 | 0001101 | 0110 | 1100010 | 1000 | 0001101 | 0110 | 1010000 | 0100 |
| 23 | 1100010 | 0110 | 1100010 | 0110 | 0001101 | 0100 | 1010000 | 0010 |
| 24 | 0001101 | 0010 | 1001111 | 1010 | 0001101 | 0010 | 1001111 | 1010 |
| 25 | 0001100 | 1010 | 1001111 | 1000 | 0001100 | 1010 | 1001111 | 1000 |
| 26 | 0001100 | 1000 | 1001111 | 0110 | 0001100 | 1000 | 1001111 | 0110 |
| 27 | 0001100 | 0110 | 1001111 | 0100 | 0001100 | 0110 | 1001111 | 0100 |
| 28 | 0001100 | 0100 | 1001111 | 0010 | 0001100 | 0100 | 1001111 | 0010 |
| 29 | 1100001 | 0100 | 1100001 | 0100 | 1100001 | 0100 | 1100001 | 0100 |
| 61 | 1010100 | 0101 | 1010100 | 0101 | 0010001 | 0111 | 1010100 | 0101 |

TABLE I-continued

SYNTHESIZER ADDRESS CODES

| | USA CODES | | | | ITU CODES | | | |
|---|---|---|---|---|---|---|---|---|
| | TRANSMIT | | RECEIVE | | TRANSMIT | | RECEIVE | |
| CH | n1 | n2 | n1 | n2 | n1 | n2 | n1 | n2 |
| 62 | 1010100 | 0011 | 1010100 | 0011 | 0010001 | 0101 | 1010100 | 0011 |
| 63 | 1010100 | 0001 | 1010100 | 0001 | 0010001 | 0011 | 1010100 | 0001 |
| 64 | 1010011 | 1001 | 1010011 | 1001 | 0010001 | 0001 | 1010011 | 1001 |
| 65 | 0010000 | 1001 | 1100110 | 0001 | 0010000 | 1001 | 1010011 | 0111 |
| 66 | 0010000 | 0111 | 1100101 | 1001 | 0010000 | 0111 | 1010011 | 0101 |
| 67 | 0010000 | 0101 | 1100101 | 0111 | 0010000 | 0101 | 1100101 | 0111 |
| 68 | 0010000 | 0011 | 1100101 | 0101 | 0010000 | 0011 | 1100101 | 0101 |
| 69 | 0010000 | 0001 | 1100101 | 0011 | 0010000 | 0001 | 1100101 | 0011 |
| 70 | 0001111 | 1001 | 1100101 | 0001 | 0001111 | 1001 | 1100101 | 0001 |
| 71 | 0001111 | 0111 | 1100100 | 1001 | 0001111 | 0111 | 1100100 | 1001 |
| 72 | 0001111 | 0101 | 1100100 | 0111 | 0001111 | 0101 | 1100100 | 0111 |
| 73 | 0001111 | 0011 | 1100100 | 0101 | 0001111 | 0011 | 1100100 | 0101 |
| 74 | 0001111 | 0001 | 1100100 | 0011 | 0001111 | 0001 | 1100100 | 0011 |
| 75 | 1100100 | 0001 | 1100100 | 0001 | 1100100 | 0001 | 1100100 | 0001 |
| 76 | 1100011 | 1001 | 1100011 | 1001 | 1100011 | 1001 | 1100011 | 1001 |
| 77 | 0001110 | 0101 | 1100011 | 0111 | 0001110 | 0101 | 1100011 | 0111 |
| 78 | 0001110 | 0011 | 1100011 | 0101 | 0001110 | 0011 | 1010001 | 0001 |
| 79 | 0001110 | 0001 | 1100011 | 0011 | 0001110 | 0001 | 1010001 | 1001 |
| 80 | 0001101 | 1001 | 1100011 | 0001 | 0001101 | 1001 | 1010000 | 0111 |
| 81 | 1100010 | 1001 | 1100010 | 1001 | 0001101 | 0111 | 1010000 | 0101 |
| 82 | 1100010 | 0111 | 1100010 | 0111 | 0001101 | 0101 | 1010000 | 0011 |
| 83 | 1100010 | 0101 | 1100010 | 0101 | 0001101 | 0011 | 1010000 | 0001 |
| 84 | 0001101 | 0001 | 100111 | 1001 | 0001101 | 0001 | 1001111 | 1001 |
| 85 | 0001100 | 1001 | 100111 | 0111 | 0001100 | 1001 | 1001111 | 0111 |
| 86 | 0001100 | 0111 | 1001111 | 0101 | 0001100 | 0111 | 101111 | 0101 |
| 87 | 0001100 | 0101 | 1001111 | 0011 | 0001100 | 0101 | 1001111 | 0011 |
| 88 | 0001100 | 0011 | 1100001 | 0101 | 0001100 | 0011 | 1001111 | 0001 |
| 89 | 1100001 | 0011 | 1100001 | 0011 | 1100001 | 0011 | 1100001 | 0011 |
| WX 1 | 1001100 | 1010 | 1001100 | 1010 | 1001100 | 1010 | 1001100 | 1010 |
| WX 2 | 1001101 | 0110 | 1001101 | 0110 | 1001101 | 0110 | 1001101 | 0110 |
| WX 3 | 1001101 | 0011 | 1001101 | 0011 | 1001101 | 0011 | 1001101 | 0011 |
| WX 4 | 1100100 | 0010 | 1100100 | 0010 | 1100100 | 0010 | 1100100 | 0010 |

The illegal channel detector 322 is connected by line 330 to a "99" digit input circuit 332. A clock 334 is connected by line 336 to a 4-bit counter 338. The 4-bit counter 338 is connected by lines 340 to the keyboard detector 290 and "99" input 332. The signal processor 328 is connected by lines 342 to the 25 w terminal 162, 1 w terminal 164, microphone hook terminal 110, push-to-talk terminal 128, and PA switch 236 of the front panel PWB 22 (FIG. 4a) and to phase lock terminal 592 (FIG. 8) and provides outputs to a receiver power switch terminal 604 (FIG. 4a), tens blanking terminal 206 (FIG. 4b), units blanking terminal 188, phase lock loss indicator 230, and transmit indicator 232.

Figure 7A:
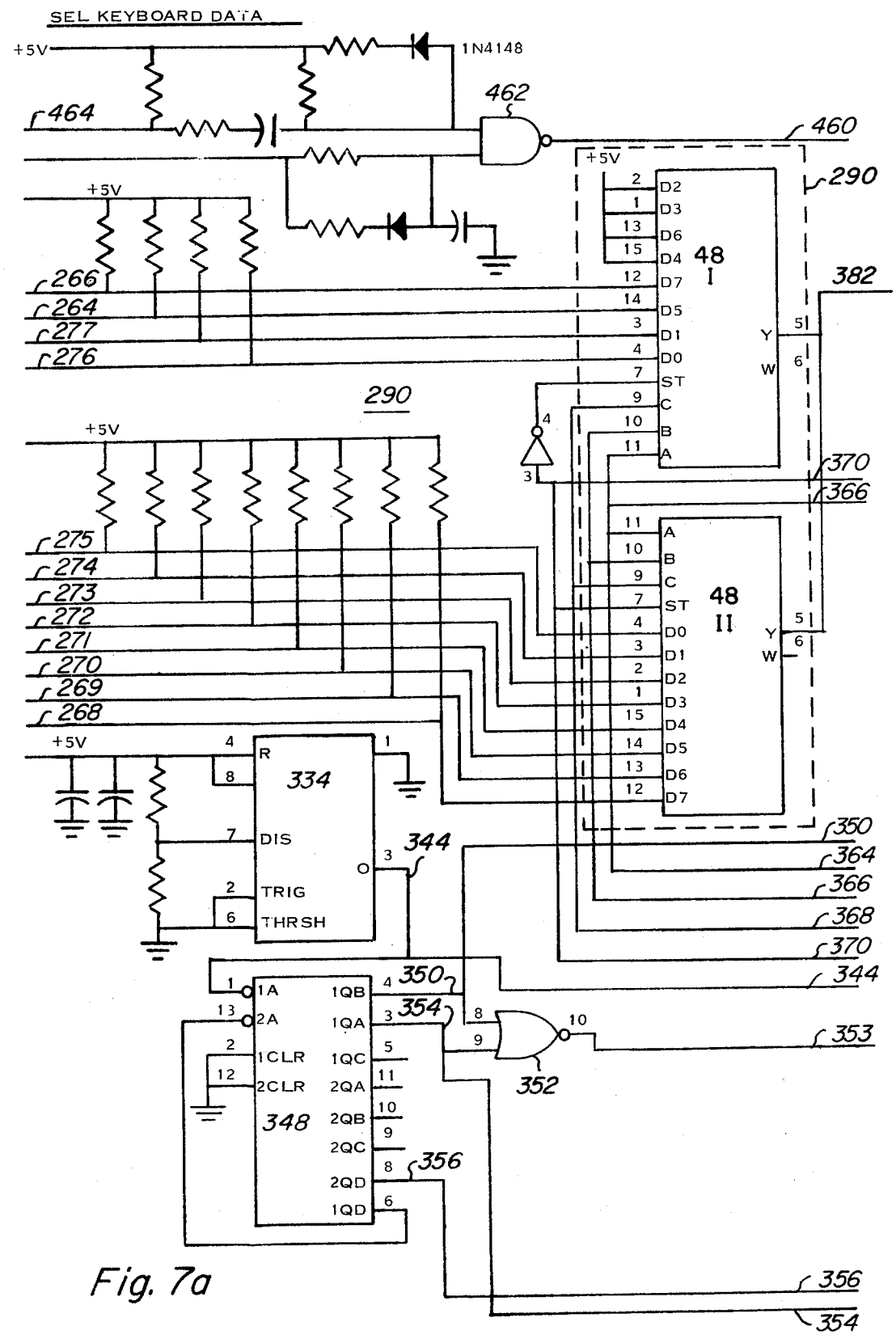
FIGS. 7a–7f are schematics of the digital input/output printed wiring board.
Figure 7B:
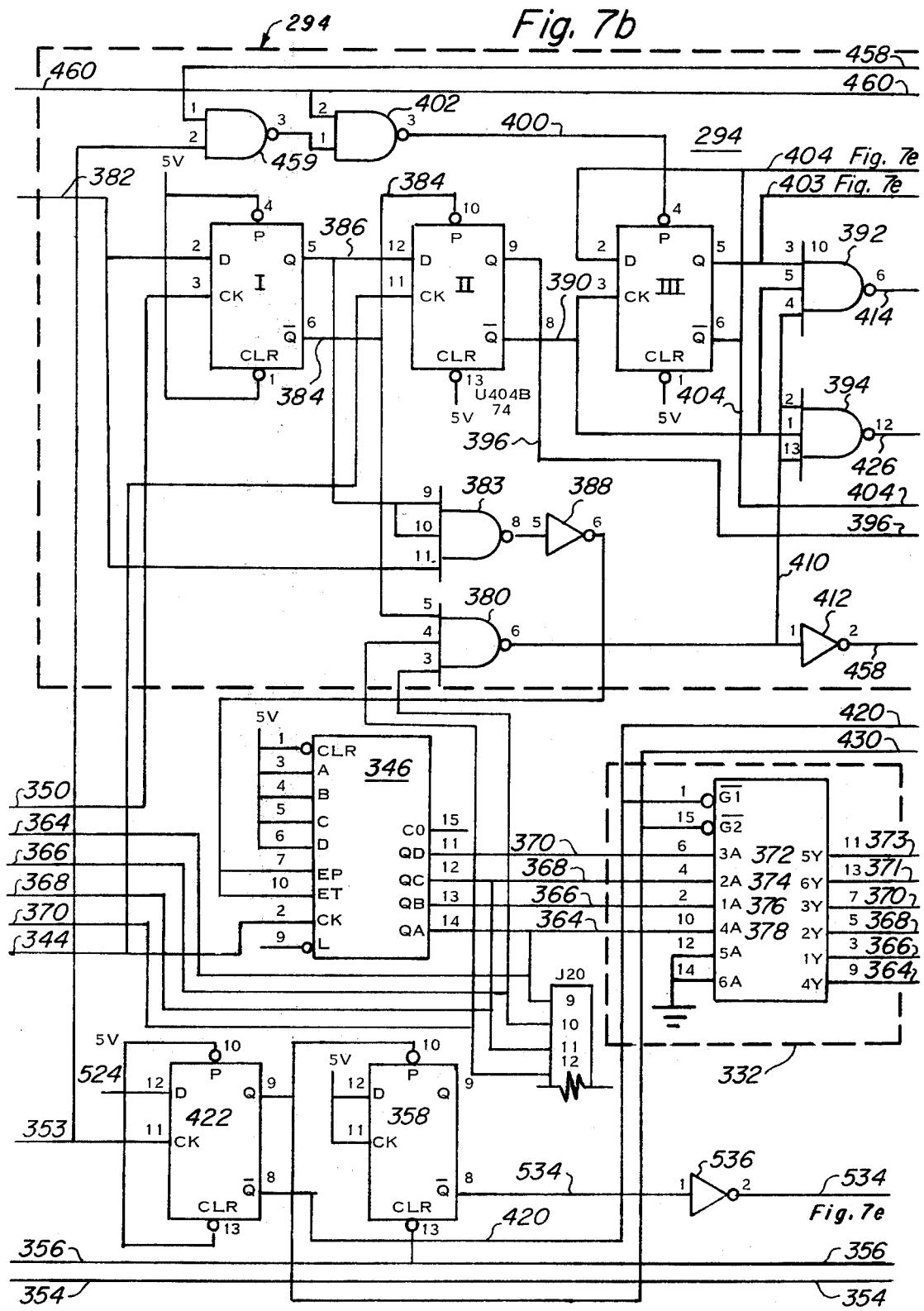
Figure 7C:
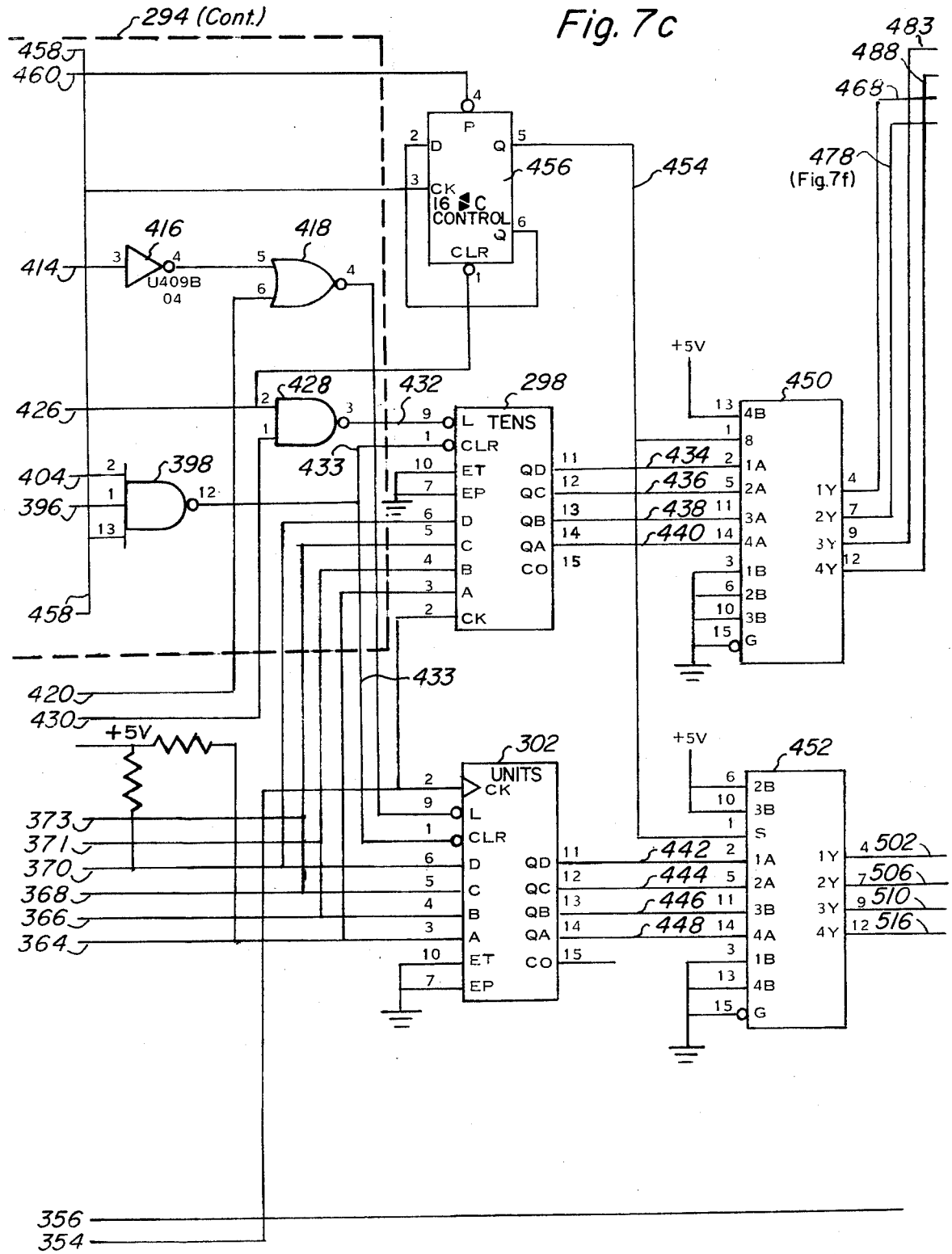
Figure 7D:
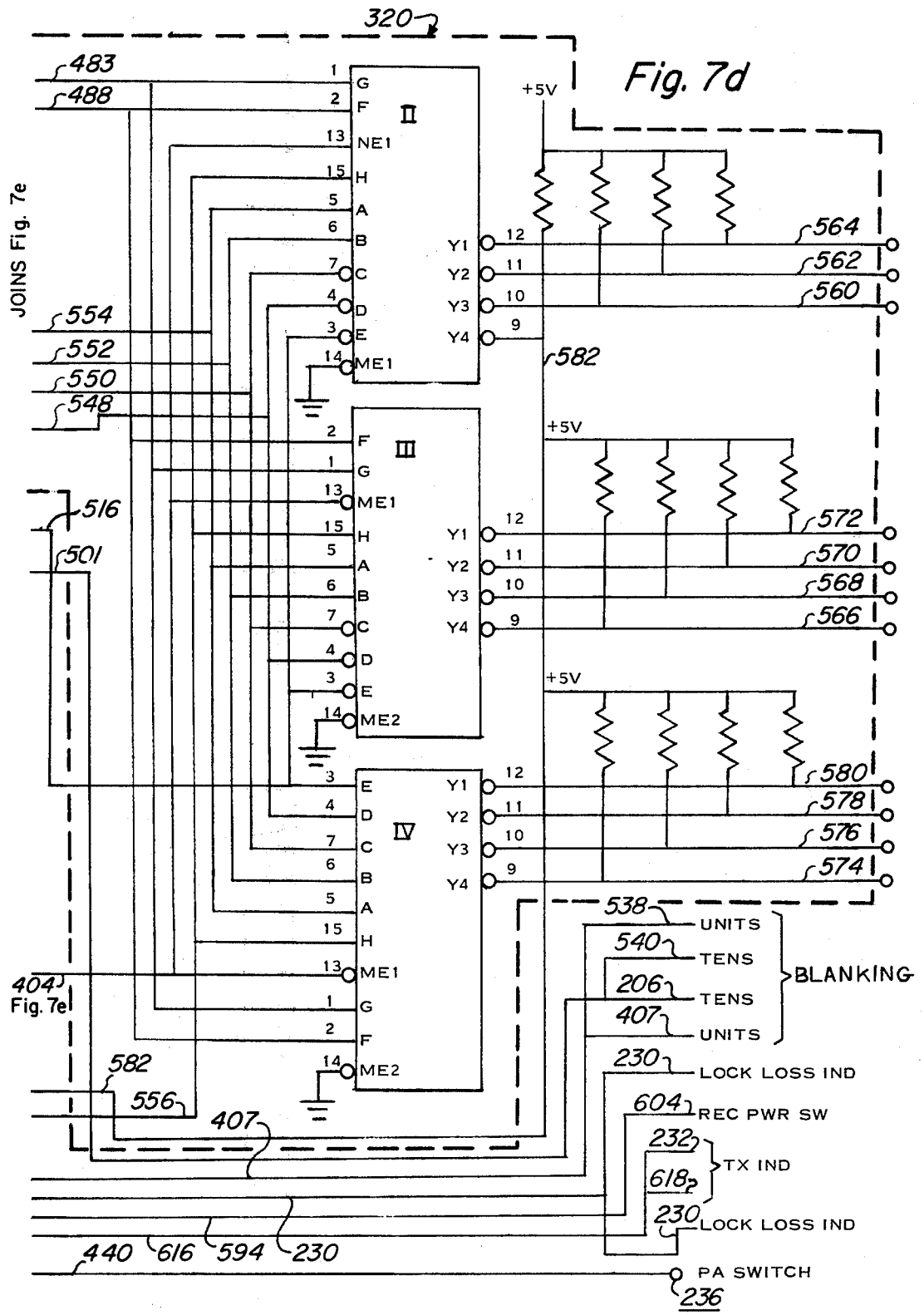
Figure 7E:
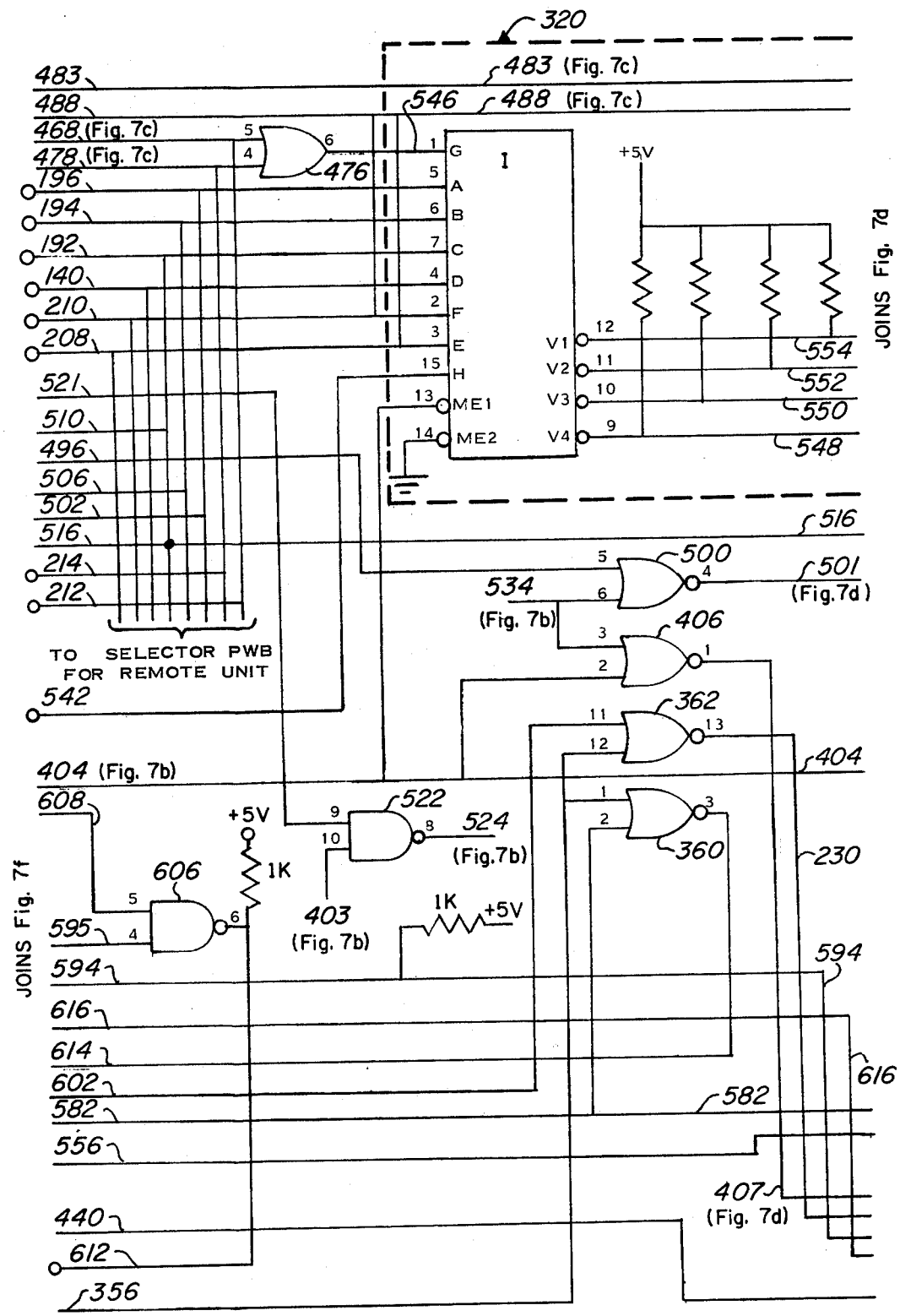

Referring now to FIGS. 7a–7f, for a detailed description of the digital I/O/power supply PWB 24, the clock 334 (FIG. 7a) which may, for example, be a 512 Hz clock, is connected by lead 344 to counter 346 (FIG. 7b), flip-flop II of the load control 294 and a divide by 128 divider 348 (FIG. 7a). The divide by 128, which is, for example, a 74 LS 393 4-bit decoder and binary counter provides: by lead 350 a 64 Hz clock signal to NOR gate 352 and to flip-flop I of load control 294 (FIG. 7b); by lead 354 a 128 Hz clock signal to the NOR gate 352 and the units and tens registers 302 and 298 (FIG. 7c); and by lead 356 a 2 Hz clock signal to a flip-flop 358 (FIG. 7b) and OR gate 362 (FIG. 7e).

The counter 346 (FIG. 7b), which is for example, 74LS161 synchronous 4-bit counter, is connected by leads 364, 366, 368, 370 to multiplexers I and II of keyboard detector 290, and through circuit breakers 372, 374, 376, and 378 (FIG. 7b) to input terminals (PINS 3, 4, 5, 6) of the tens and units registers 298 and 302 (FIG. 7c). The counter's (FIG. 7b) leads 370 and 366 are also connected to NAND gate 380. The keyboard detector multiplexers I and II (FIG. 7a), which are, for example, SN74L251's use 16 counts to scan the keyboard 48 (FIG. 5b) and when a pressed key is detected, to provide pulsed outputs (PINS 5) through lead 382 to the data terminal (PIN 2) of flip-flop I (FIG. 7b) and to NAND gate 383.

Flip-flop I of load control 294 has its $\overline{Q}$ terminal connected by lead 384 to the reset terminal (PIN 10) of flip-flop II and to the NAND gate 380; and its Q terminal connected by lead 386 to data in terminal of flip-flop II and to the NAND gate 383. NAND gate 383 has its inverted output connected through an inverter 388 to the enable terminals of the counter 346. The NAND gate 383 acts as a count hold for the counter 346. The $\overline{Q}$ output of flip-flop II is connected by lead 390 to clock terminal of flip-flop III and to NAND gates 392 and 394; its Q terminal is connected by lead 396 to NAND gate 398 (FIG. 7c).

Flip-flop III (FIG. 7b) has its preset terminal (PIN 4) connected by lead 400 to the output of AND gate 402. The Q terminal of flip-flop III is connected by lead 403 to NAND gate 392 and to an input terminal of AND gate 522 (FIG. 7e); its $\overline{Q}$ terminal (FIG. 7b) is connected by lead 404 back to the data in terminal (PIN 2), NAND gate 394, chip select terminal of ROM I (FIG. 7e), II, III, and IV (FIG. 7d), OR gate 406 (FIG. 7e) synthesizer enable terminal 404 (FIG. 9h) and NAND gate 398 (FIG. 7c).

NAND gates 392 and 394 (FIG. 7b) have inputs connected by lead 410 to the output of NAND gate 380. The NAND gate 392 has its output connected by lead 414 to inverter 416 (FIG. 7c); inverter 416 is connected to NOR gate 418. The other input of NOR gate 418 is connected by lead 420 to the $\overline{Q}$ output of flip-flop 422 (FIG. 7b). The output of NOR gate 418 (FIG. 7c) is connected by lead 424 to inverted load input of units register 302.

The output of NAND gate 394 (FIG. 7b) is connected by lead 426 to the clear terminal of flip-flop 456 (FIG. 7c) of the "16-C" control and NAND gate 428. The other input of NAND gate 428 is connected by lead 430 to the Q terminal of flip-flop 422 (FIG. 7b). The output of NAND gate 428 (FIG. 7c) is connected by lead 432 to the load terminal of the tens register 298.

Figure 7F:
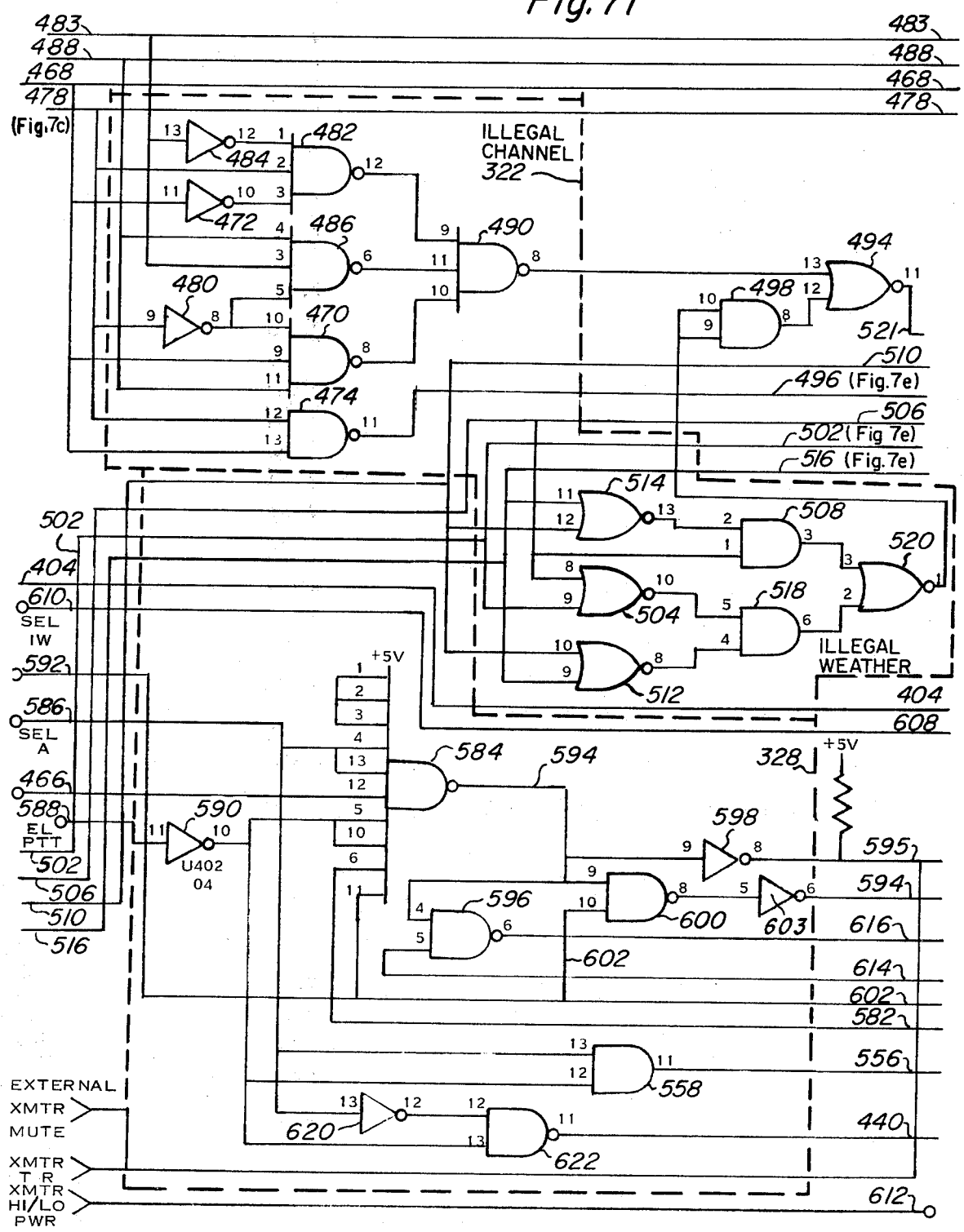

The NAND gates 392 and 394 control the tens and units inputs to their respective registers 298 and 302. The tens and units registers 298 and 302, which are, for example, 74LS161's have their clear (1) pins connected by lead 433 to the output of NAND gate 398. The outputs of the tens and units registers 298 and 302 are connected by leads 434, 436, 438, and 440, and leads 442, 444, 446, and 448, respectively, to the tens and units data selectors 450 and 452, which are, for example, 74LS157, 2 line-to-1 line data selectors/multiplexers. The select pins (PIN 1) of the tens and units data selectors 450 and 452 are connected by lead 454 to the Q terminal of the "16-C" control flip-flop 456. The $\overline{Q}$ terminal of flip-flop 456 is connected back to its input terminal (PIN 2), and its clock input terminal is connected by lead 458 to the output of an inverter 459 (FIG. 7b). The preset terminal (PIN 4) of flip-flop 456 (FIG. 7c) is connected by lead 460 to the output of NAND gate 462 (FIG. 7a). NAND gate 462 has one input connected to a pull up circuit and its other input connected by lead 464 to the microphone hook terminal 466 (FIG. 7f). The Q output of the "16-C" control flip-flop 456 (FIG. 7c) operates the tens and units data selectors to switch from a legal channel to channel "16-C".

Figure 4B:
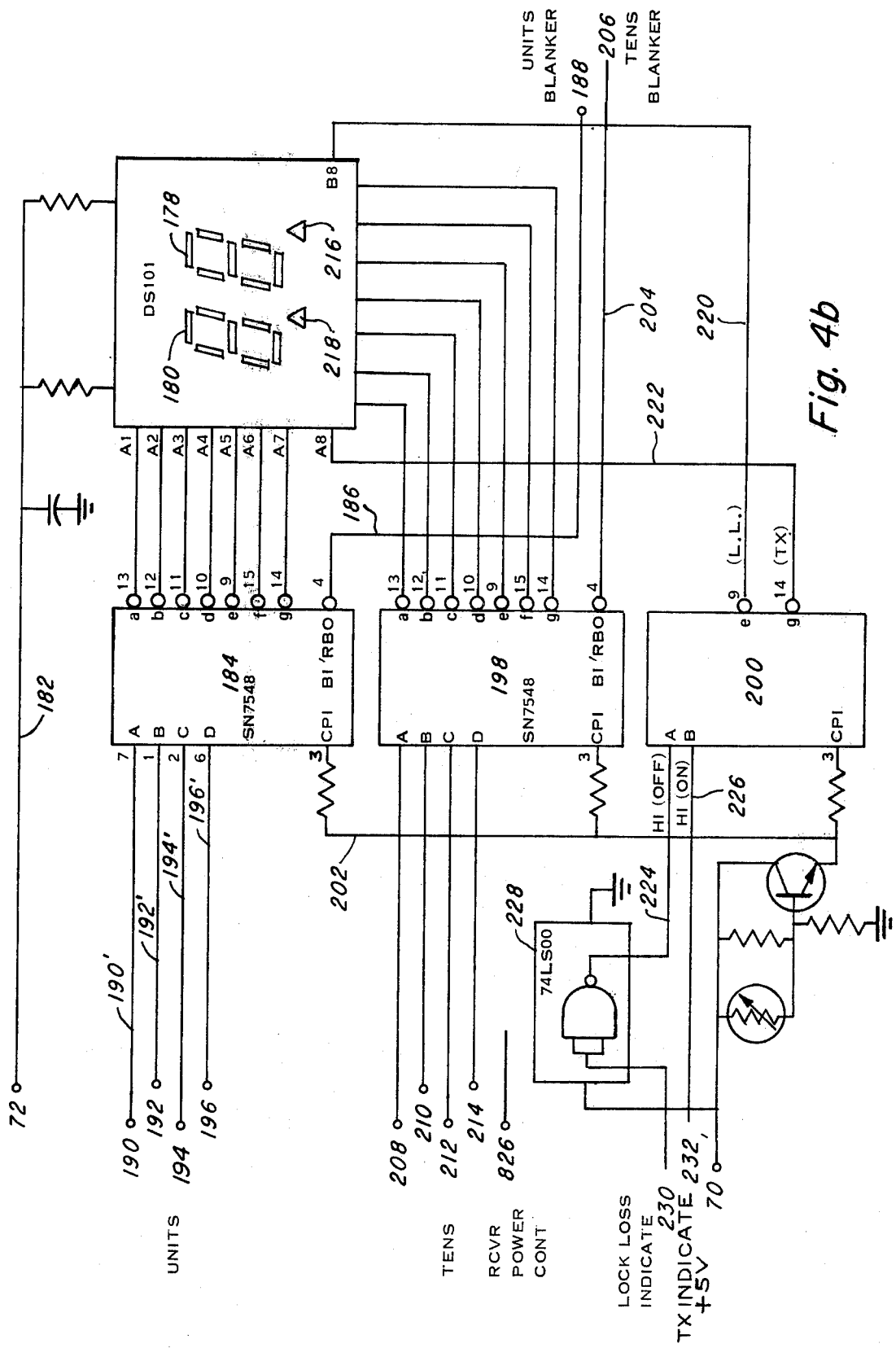

The output pins of the tens data selector 450 (FIG. 7c) are connected as follows: PIN 4 by lead 468 to NAND gate 470 (FIG. 7f), inverter 472, AND gate 474, OR gate 476 (FIG. 7e) and tens display driver terminal 214 (FIG. 4b); PIN 7 (FIG. 7c) by lead 478 (FIG. 7f) to inverter 480, NAND gate 482, AND gate 474, OR gate 476 (FIG. 7e); PIN 9 (FIG. 7e) by lead 483 (FIG. 7f) to inverter 484, NAND gate 486, ROM I, PIN 2 (FIG. 7e), ROMs (FIG. 7d) II, PIN 1, III, PIN 1, and IV, PIN 1 of memory 320 and tens panel display terminal 210 (FIG. 4b); and PIN 12 (FIG. 7c) by lead 488 to NAND gates 470 and 486 (FIG. 7f), ROM I, PIN 3 (FIG. 7e), and ROMS (FIG. 7d) II, PIN 2, III, PIN 2, and IV, PIN 2, and tens panel display terminal 208 (FIG. 4b). The outputs of NAND gates 470 and 486 (FIG. 7f) are connected to NAND gate 490. The outputs of inverters 472 and 484 are connected to NAND gate 482; the outputs of NAND gates 470, 482, and 486 are connected to NAND gate 490. This inverter, NAND gate assembly provides an illegal channel detector 322 whose output from NAND gate 490 is connected by lead 492 to OR gate 494. The NAND gate 474 provides a tens output blanking signal through lead 496 to AND gate 498 and to NOR gate 500 (FIG. 7e) of the tens blanking circuit for the weather channel detector.

The output terminals of the units data selector 452 (FIG. 7c) are connected as follows: PIN 4 by lead 502 to NOR gate 504 (FIG. 7f), ROM I, PIN 5 (FIG. 7e), and units display terminal 196 (FIG. 4b); PIN 7 (FIG. 7c) by lead 506 to NOR gate 504 and AND gate 508 (FIG. 7f), ROM I, PIN 6 (FIG. 7e) and units display terminal 194 (FIG. 4b); PIN 9 (FIG. 7c) by lead 510 to OR gate 512, NOR gate 514 (FIG. 7f), ROM I, PIN 7 (FIG. 7e), and units display terminal 194 (FIG. 4b); and PIN 12 (FIG. 7c) by lead 516 to OR gate 512 and NOR gate 514 (FIG. 7f), ROM I PIN 4 (FIG. 7e), and ROMS II, III, and IV (PINS 3) (FIG. 7d), and units display terminal 190 (FIG. 4b). The outputs of NOR gate 512 (FIG. 7f) and NOR gate 504 are connected to AND gate 518. The outputs of AND gates 518 and 508 are connected to NOR gate 520. This NOR-AND gate circuit provides at the output of NOR gate 520 an illegal weather unit indicator signal to the AND gate 498. The output of AND gate 498 is to OR gate 494. The output of OR gate 494 is connected by lead 521 to NAND gate 522 (FIG. 7e). NAND gate 522, as stated previously, has its other terminal connected by lead 403 to the Q output of flip-flop III of the load control 294. The output of NAND gate 522 is connected by lead 524 to the data in terminal PIN D) of flip-flop 422 (FIG. 7b).

The $\overline{Q}$ output of flip-flop 422 is connected by lead 420 to the enable terminal $\overline{G\text{-}1}$ of circuit breakers 372, 374, 376 and 378 (FIG. 7b), and the AND gate 418 (FIG. 7c). The output terminal PINS 11, 13 of enbale terminals $\overline{G\text{-}1}$, and $\overline{G\text{-}2}$ (FIG. 7b) of circuit breakers 372–378 are connected by leads 371 and 373 to the input terminals 5 and 4 (Fig. 7c) of the tens and units registers.

The drivers 372, 374, 376, and 378 and enable terminals $\overline{G\text{-}1}$ and $\overline{G\text{-}2}$ act in response to flip-flop 422 to input nines to the tens and units registers and from the "99" input 332. The "99" input is displayed to indicate errors. The flip-flop 358 has its $\overline{Q}$ output connected by lead 534 through inverter 536 to NOR gates 406 and 500 (FIG. 7e). The outputs of NOR gates 406 and 500 are by leads 407 and 501 to units and tens blanking terminals, 538, and and 540 (FIG. 7d) and 188 and 206 (FIG. 4b), to make the "99" display a flashing display. Terminals 538 and 540 are for a remote panel now shown.

ROM I (FIG. 7e), which may be, for example, a 74187, a ROM memory 320 has its input PINS connected as follows: control (PIN 15) connected by lead 542 to the U.S.A./ITU switch terminal 176 (FIG 4a); PINS 1, 2, and 3 connected by leads 546, 483 and 488 to the channel tens selector 450 (FIG. 7c) outputs; and PINS 4, 7, 6, 5, connected by leads 516, 510, 506, and 502 to the channel units selector 452 data word outputs. ROM I (FIG. 7e) addresses ROM's II, III, and IV (FIG. 7d) which are, for example 74187's. ROM I (FIG. 7e) is connected to ROM's II, III, and IV as follows: PIN 9 is connected by lead 548 to the 4 PINS of ROM's II, III, and IV (FIG. 7d); PIN 10 is connected by lead 550 to the 7 PINS of ROM's II, III, and IV; PIN 11 is connected by lead 552 to the 6 PINS of ROM's II, III, and IV; and PIN 12 is connected by lead 554 to the 5 PINS of ROM's II, III and IV. ROM's II, III, and IV (FIG. 7d) have their 1 and 2 PINS connected, respectively, by leads 483 and 488 to the tens selector 450; their 3 PINS connected by lead 516 to PIN 12 of the units selector 452 (FIG. 7c); and their 15 PINS connected by lead 556 to AND gate 558 (FIG. 7f) of the signal processing circuit 328. The chip select PINS (PIN 13) of ROM's I, II, III, and IV (FIG. 7d), as previously mentioned, are connected by lead 404 to the Q output of flip-flop III of the load control 294. The outputs of ROM's II, III, and IV provide the synthesizer address signals of TABLE I to the synthesizer 490 (FIG. 8) input terminals of the synthesizer/receiver PWB 26 as follows: ROM II, PINS 10, 11, 12 to synthesizer address terminals 560, 562, and 564 (FIG. 9b); ROM VIII, PINS 9, 10, 11 and 12 to synthesizer address terminals 566, 568, 570 and 572; and ROM IV, PINS 9, 10, 11, and 12 to synthesizer address terminals 574, 576, 578, and 580 (FIG. 9f). PIN 9 of ROM II provides a receive only signal through lead 582 to OR gate 360 (FIG. 7e), and to an input terminal of NAND gate 584 (FIG. 7f) of the signal processing means 328.

The NAND gate 584 (FIG. 7f) of the signal processing means 328, in order to enable transmission, must receive a high (logic 1) input at each input terminal from the following: the public address terminal 586; the ROM II (FIG. 7d) transmit indicating terminal (PIN 9), lead 582; the microphone hook terminal 466 (FIG. 7f); the push-to-talk terminal 588, whose output must be inverted by inverter 590 for a high (1) input; and the phase lock loss terminal 592. The output of NAND gate 584 is connected by lead 594 to the input of NAND gate 596; inverter 598; and AND gate 600. AND gate 600 has an input connected by lead 602 to the phase lock loss terminal 592; and its output inverted by inverter 603 and connected by lead 594 to the receiver power switch terminal 604 (FIG. 7d).

Inverter 598 (FIG. 7f) inverts the output of NAND gate 584 and its inverted output is connected by lead 595 to AND gate 606 (FIG. 7e). AND gate 606 has its other input connected by lead 608 to the 1 w power select terminal 610 and its output is to the transmitter high/low power control terminal 612. NAND gate 596 (FIG. 7f) has its other input terminal connected by lead 614 to the output of OR gate 360 (FIG. 7e). OR gate 360 provides a 2 Hz signal or transmit indicating signal to NAND gate 596 (FIG. 7f). The output of NAND gate 596 is a flashing transmitter indicator signal connected by lead 616 to transmit indicating terminal 618 and 232 (FIG. 7d). The PA select terminal 586 (FIG. 7f) is also connected through an inverter 620 to a NAND gate 622. The other terminal of NAND gate 622 is connected to the inverted push-to-talk terminal 588 and the output of NAND gate 622 is connected by lead 440 to the public address (PA) switch terminal 236 (FIG. 7d).

SYNTHESIZER PWB

Figure 8:
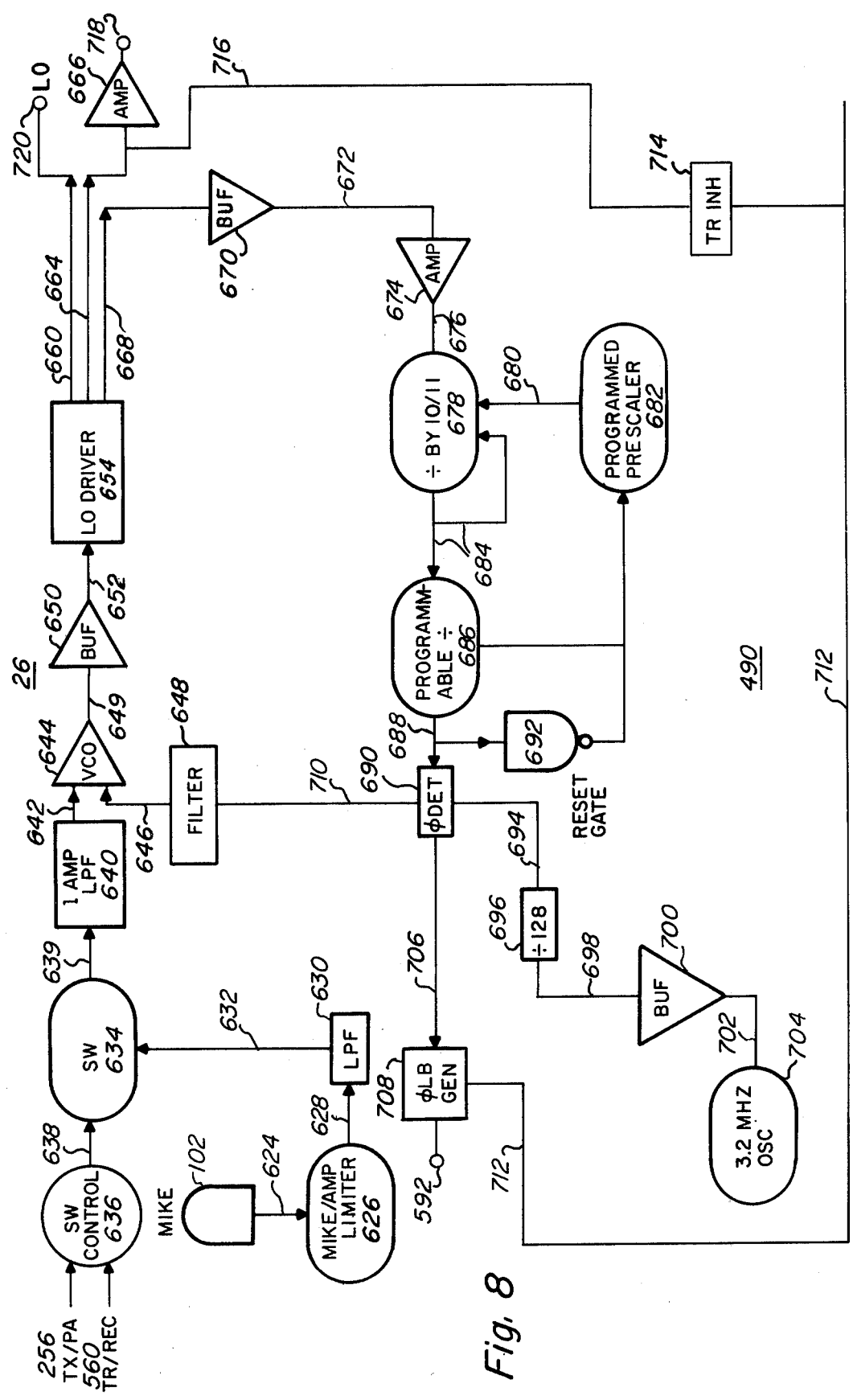
FIG. 8 is a block diagram of the synthesizer printed wiring board.
Figure 9A:
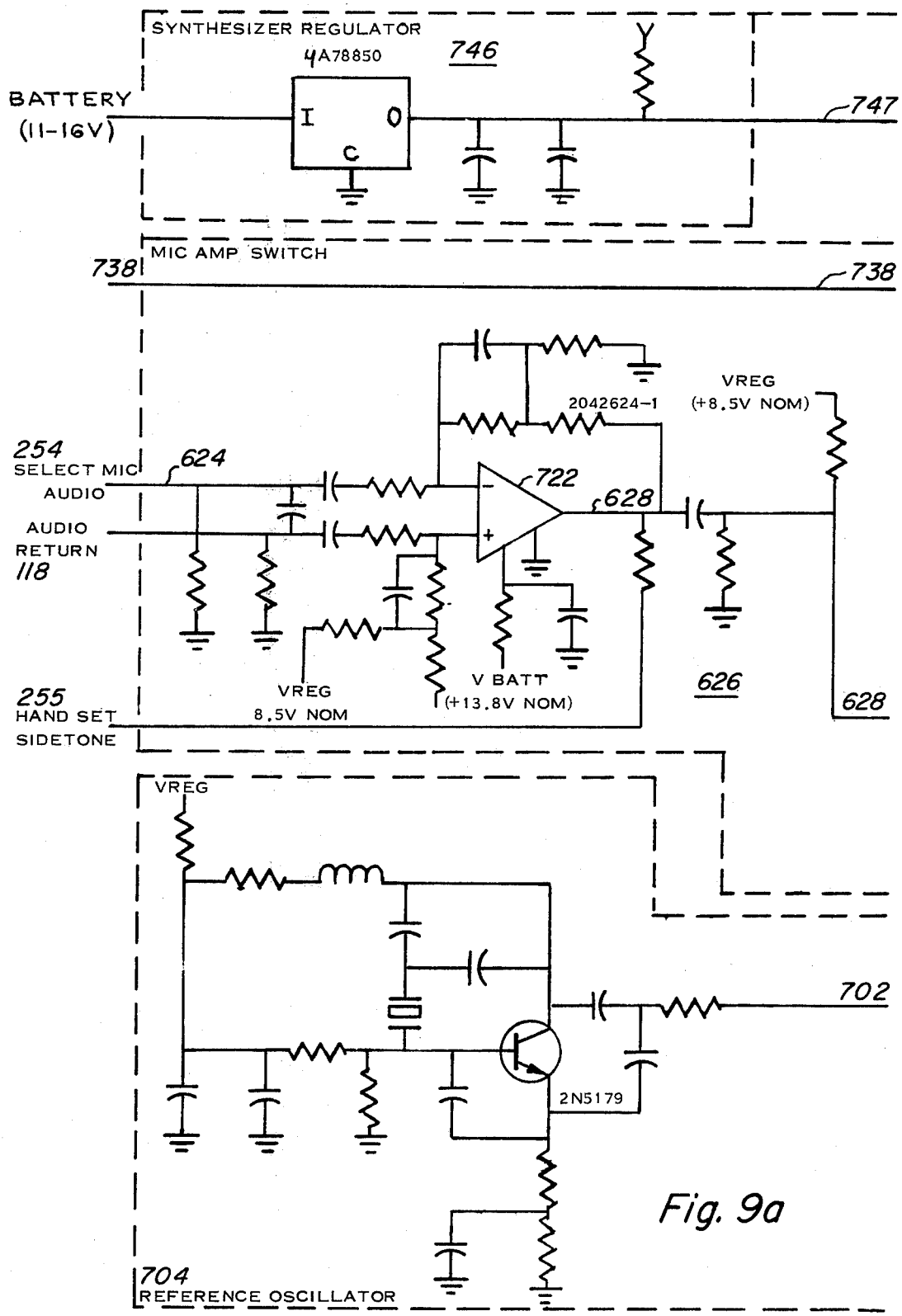
Figure 9B:
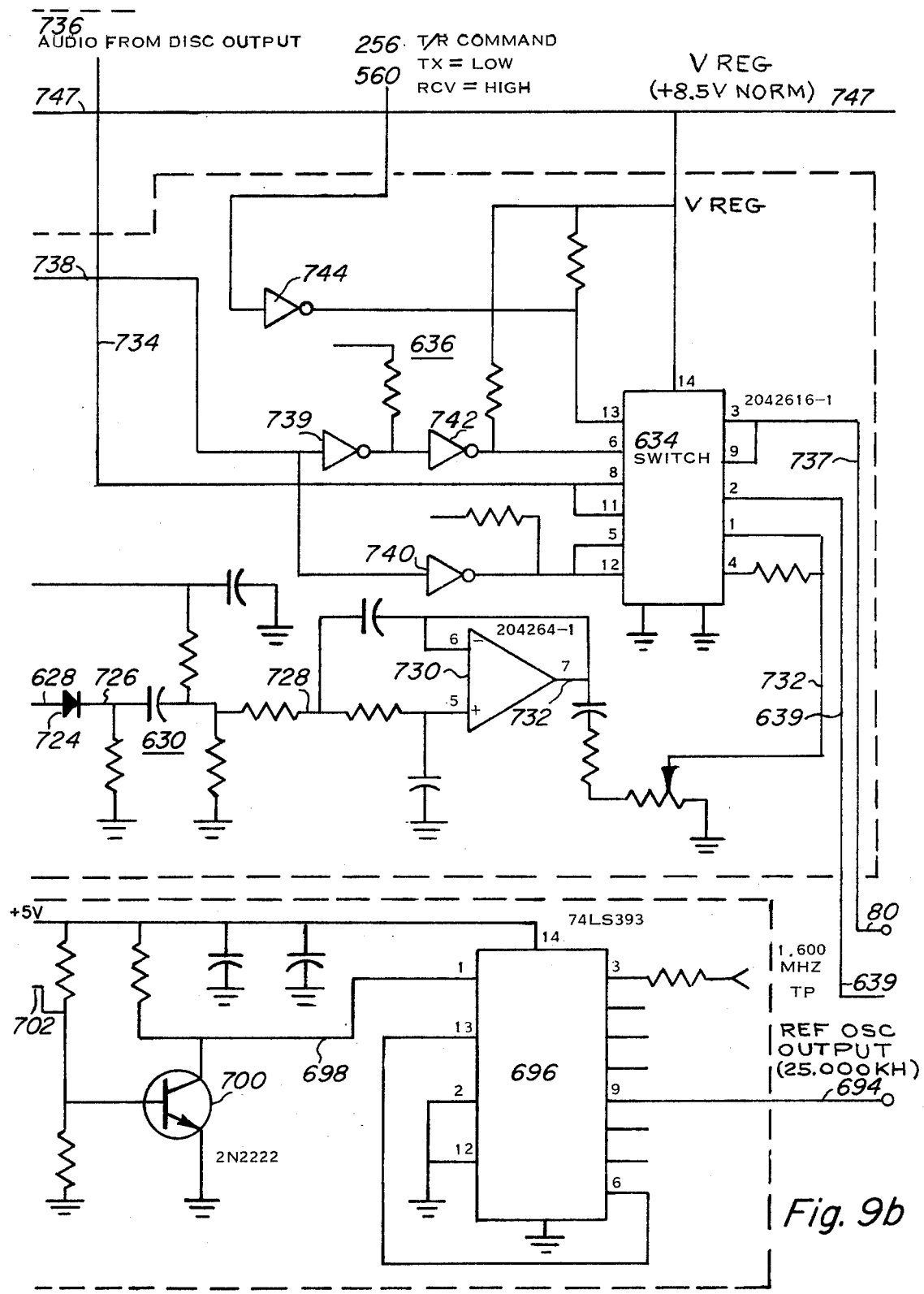
Figure 9D:
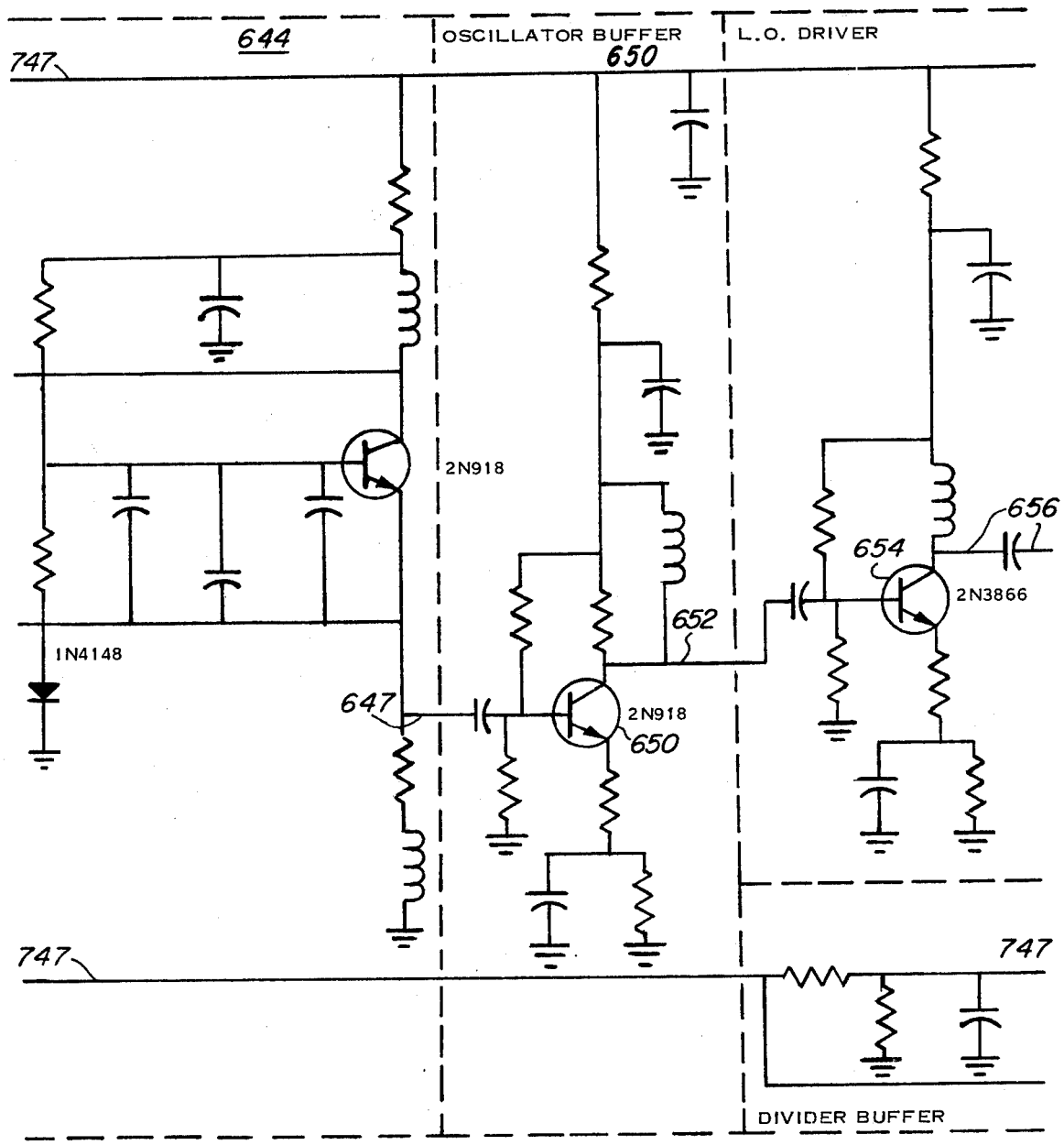
Figure 9E:
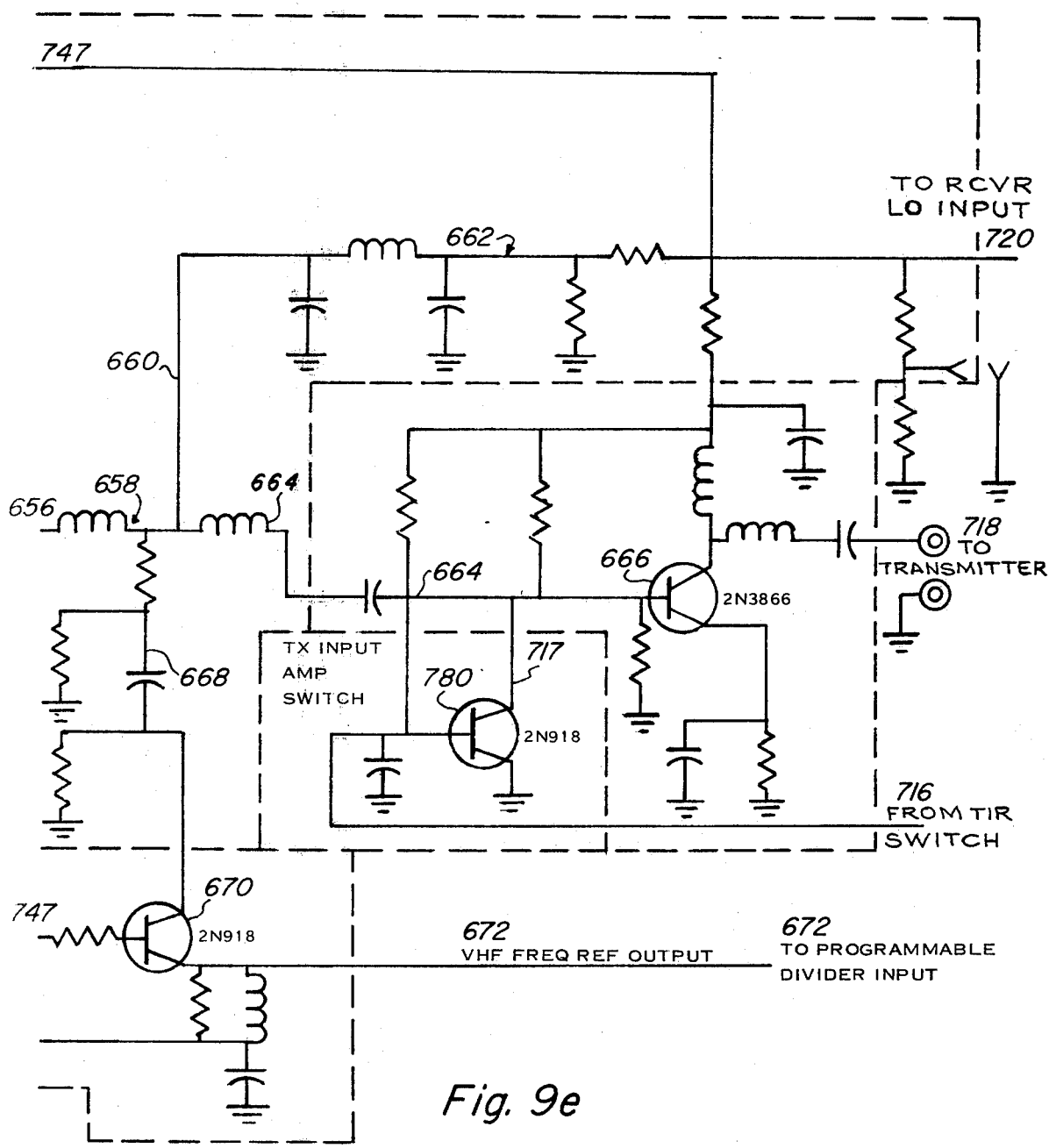
Figure 9F:
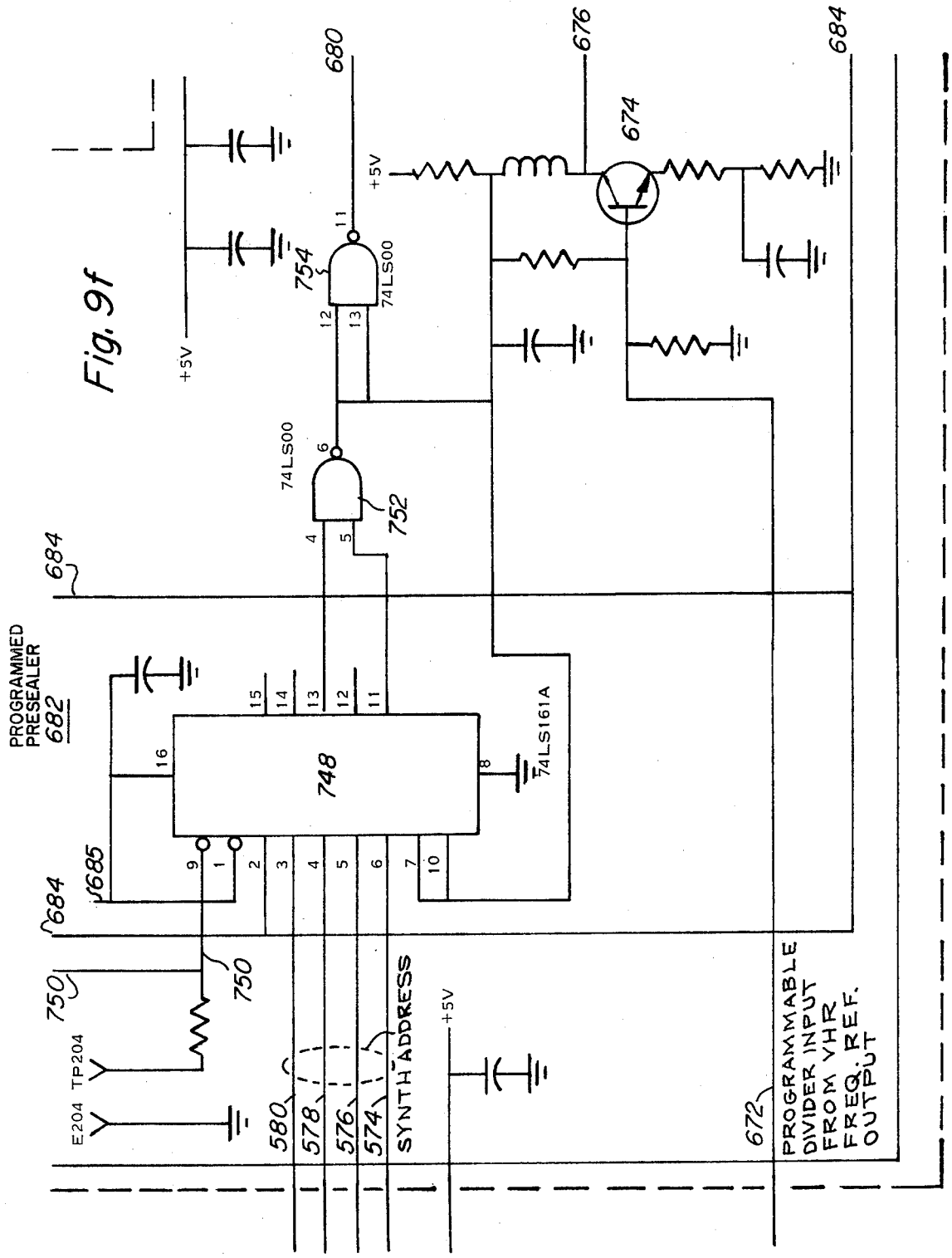
Figure 9G:
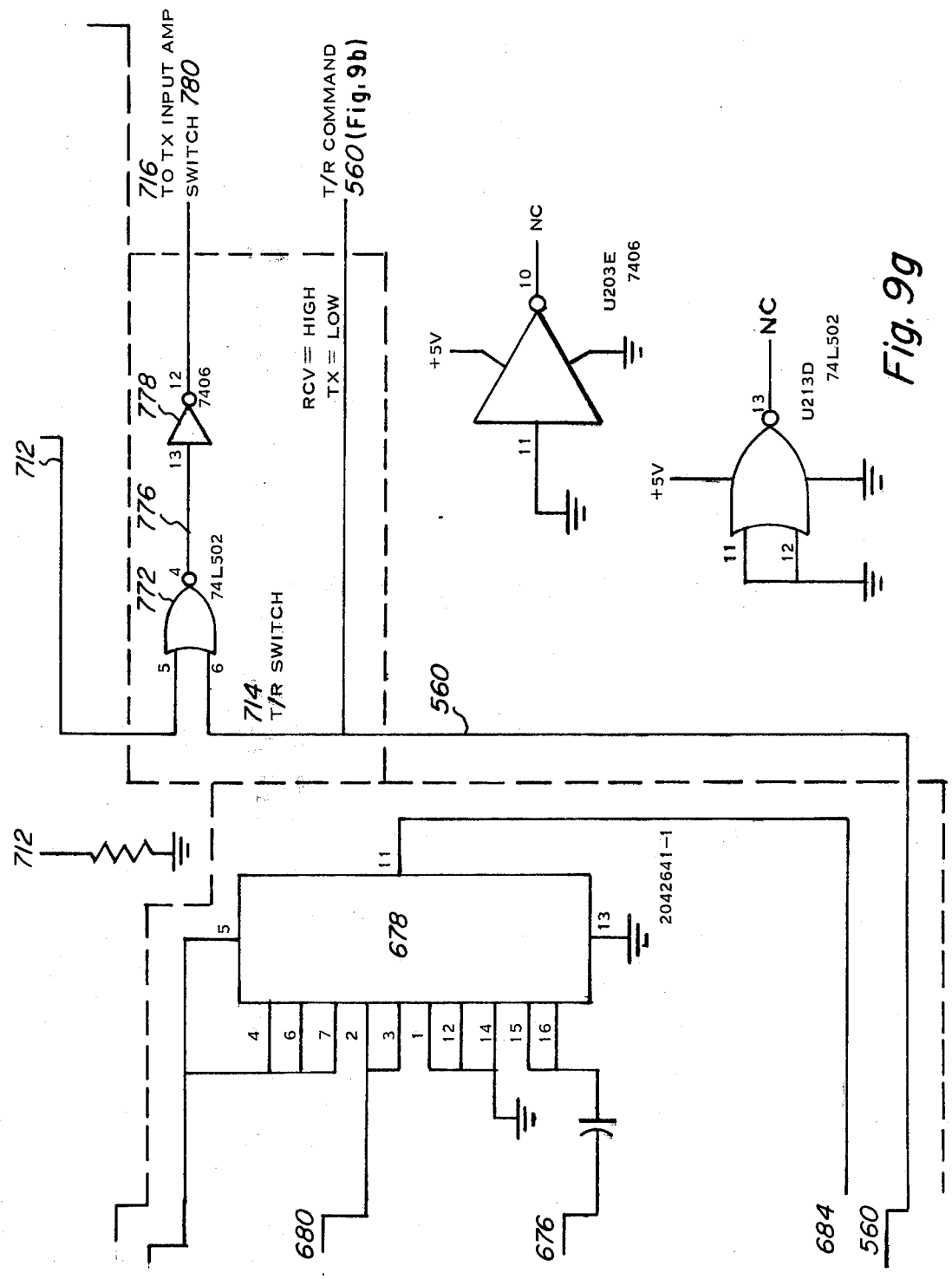
Figure 9H:
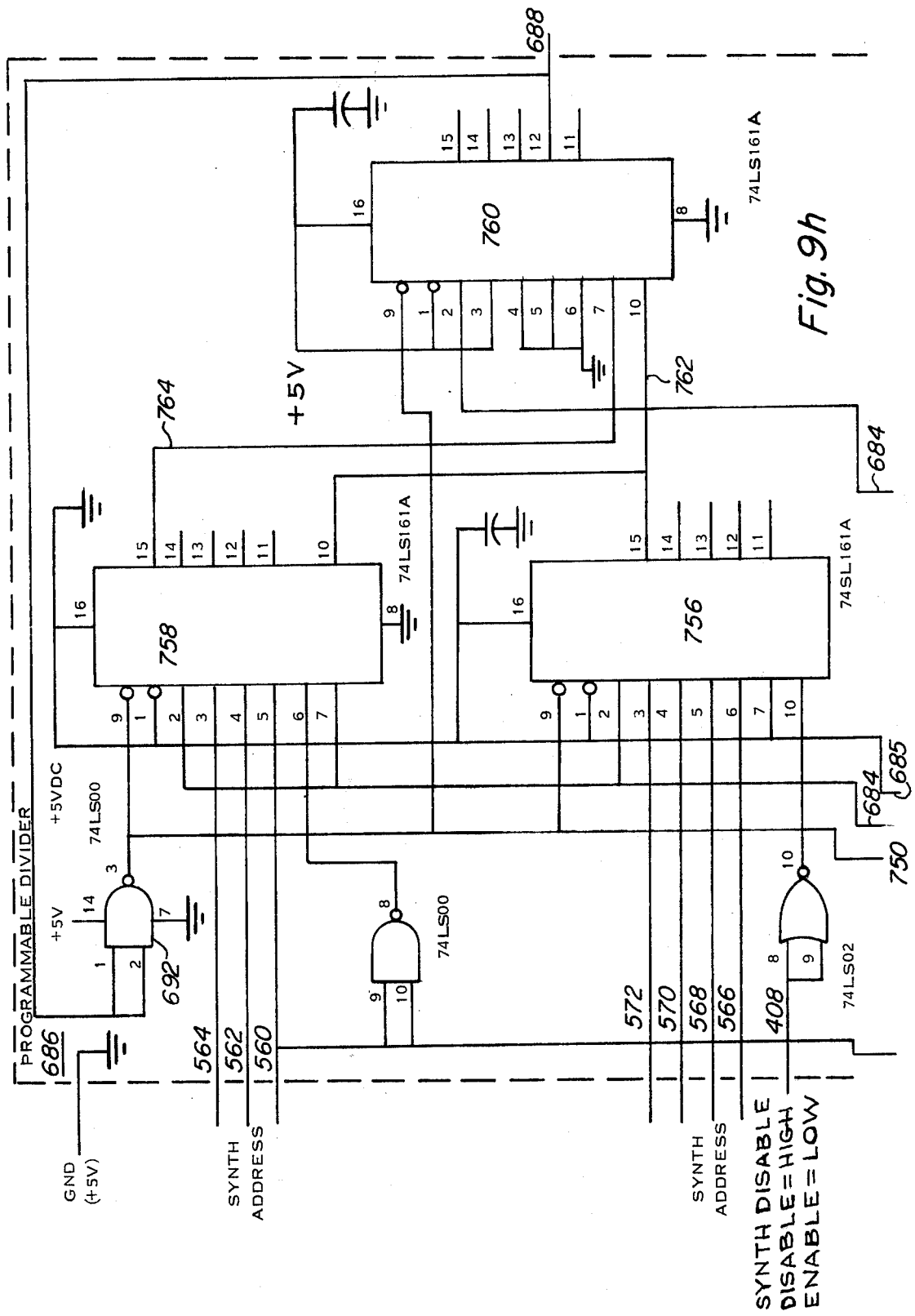
Figure 9I:
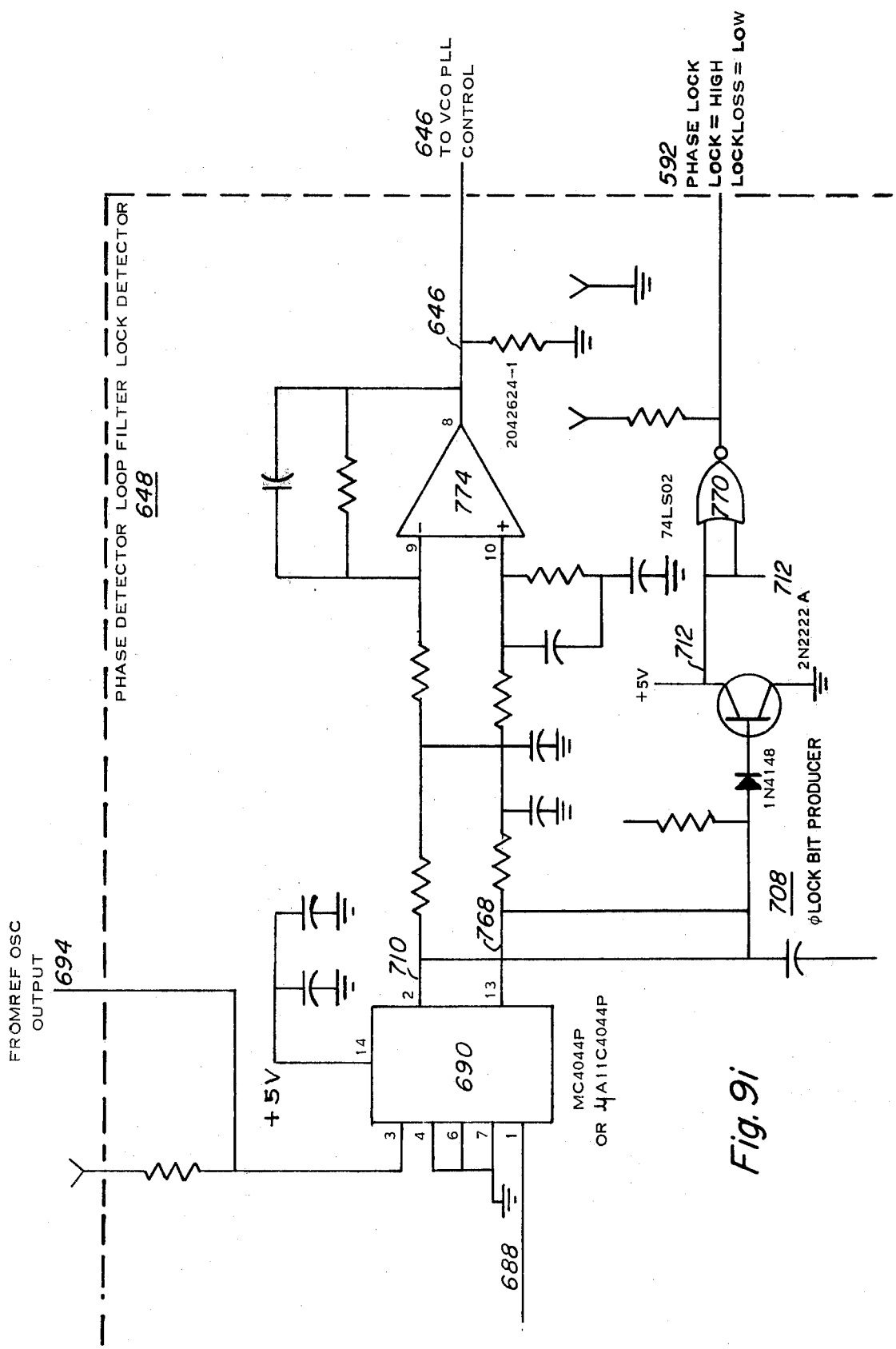

Referring now to FIGS. 8 and 9a 9i for a description of the VHF Synthesizer/Receiver PWB 26, the synthesizer/receiver PWB is shown in block diagram in FIG. 8. The microphone 102 is connected by line 624 to a microphone amplifier/limiter 626 whose output is connected by line 628 to a low pass filter 630. The filtered signal is connected by line 632 to switch 634. Switch 634, which is, for example, a CD4016C, contains four single pole, double throw switches controlled by a switch control 636 connected by line 638 to switch 634.

The switch control 636 receives transmit/receive indicating signals from ROM 1 terminal 560 and transmit/PA control signals from the PA switch terminal 256. When the transmit/receive control is in the receive mode the switch 634 is connected through the volume control and audio amplifier to the speaker and when the transmit/PA control is in the PA mode the microphone is similarly connected to the speaker. Conversely when the transmit/receive control is in the transmit mode the receiver circuit is grounded and when the transmit/PA control is in the transmit mode the microphone is connected by line 639 to the amplifier/low pass filter 640 and through line 642 to the voltage control oscillator 644 where it modulates the carrier signal.

The voltage control oscillator 644 receives a frequency correction d.c. voltage through line 646 from a loop filter 648 of a phase lock loop, hereinafter described. The output of the VCO 644 is connected by line 649 to a buffer 650 for buffering. The buffer 650 is connected by line 652 to a LO driver 654. The output of the LO driver is connected; by line 660 to local oscillator terminal 720, by line 644 to a Class A amplifier 666 whose output is connected to transmitter terminal 718 and by line 668 to buffer 670. The buffer 670, which is connected by line 672 to amplifier 674, buffers the phase lock loop feedback signal for amplification by the amplifier 674. The amplifier feedback signal of amplifier 674 is applied through line 676 to a divide by 10/11 counter 678.

The divide by 10/11 counter 678, which is connected by line 680 to a programmed prescaler control 682, is controlled by the program prescaler controller 682. The programmed prescaler controller 682 provides the divide by 10/11 counter with the number of 10 and 11 divisions to be made by the divider depending upon the channel selected. The output of the divide by 10/11 counter 678 is connected by line 684 back to the clock terminal (FIG. 2) of the programmed prescaler control 682 and to a programmable divider 686.

The programmable divider 686 divides the output of the divide by 10/11 counter to provide a preselected (25 KHz) signal through line 688 to a phase detector 690 and to a reset gate 692. The reset gate 692 provides reset signals to the programmed prescaler controller 682 and the programmable divider 686. The phase detector 690 also receives through line 694 a 25 KHz signal from a divide by 128 counter 696 which divides a 3.2 MHz buffered signal to provide the 25 KHz signal. The divide by 128 divider 696 is connected by line 698 to buffer 700 and the buffer 700 is connected by line 702 to 03.2 MHz crystal oscillator 704. Phase detector 690 compares the phase of the phase lock loop signal to the 25 KHz signal of the crystal oscillator and provides an output through line 706 to a phase lock bit generator 708 and line 710 to the phase loop filter 648.

The phase lock bit generator 708 produces at terminal 592 the phase lock indicating signal and is connected by line 712 to transmit inhibitor 714. The transmit inhibitor 714 is also connected to the transmit/receive indicating signal of ROM 1 terminal 560. The transmit inhibitor 714 is connected by lead 716 to amplifier 666. When not phase locked the transmit inhibitor 714 inhibits the amplifier 666 and transmit signals to the transmit terminal 718 are cut off. If the receiver is in lock, a zero phase difference signal is produced by the loop filter 648 for the VCO 644 and if the receiver is not in lock a d.c. voltage correction signal.

Referring now to FIGS. 9a–9i for a more detailed description of the VHF synthesizer 490. The microphone terminal 254 (FIG. 9a) is connected by lead 624 to the negative terminal of an operational amplifier 722 of the microphone amplifier/limiter 626. The positive terminal of amplifier 722 is connected to the microphone return terminal 118. The output of amplifier 722 is connected by lead 628 to the handset side tone terminal 255 and to limiter 724 (FIGS. 9a–9b). The limiter 724 is a diode type limiter. The output of limiter 724 is connected by lead 726 to the low-pass filter 630 (FIG. 9b) which passes the audio signals of microphone 102. The filter's output, which is connected through lead 728 to amplifier 730, is amplified by amplifier 730 and its amplified output is connected by lead 732 through a variable filter to input terminals 1 and 4 of a four pole switch 634. Switch 634 may be, for example, a CD4016C solid state switch.

The receiver input signals received at terminal 736 (FIG. 9b) are connected by lead 734 to input PINS 8 and 11 of switch 634 and the audio output signals (PINS 3 and 9) are connected by lead 737 to audio amplifier terminal 80. The switch 634 is controlled by the switch control circuit 636, the transmit (logic 1) or public address (logic 0) select signals of terminal 256 (FIG. 9b) and an inverter 740 of switch controller 636. Inverter 739 is connected to an inverter 742 whose output is connected to PIN 6 of switch 634. Inverter 740 is connected to PINS 5 and 12 of the switch 634. Transmit/receive signals are applied to the switch control through lead 560 connected to inverter 744 whose output is connected to PIN 13 of switch 634. PIN 13 receives a logic 0 signal for transmit and a logic 1 for receive.

A regulator 746 (FIG. 9a) provides by lead 747 the VCC to PIN 14 of the switch 634 (FIG. 9b). The switch, which provides either the received signal or modulated transmit signal at PIN 2, is connected by lead 639 to an amplifier 748 (FIG. 9c) whose output is tuned in the resonant circuit of modulator driver 640. The output of the modulator driver 640 is connected by lead 642 to the voltage control oscillator 644 (FIGS. 9c and 9d). The VCO is a standard VCO. The output of the VCO 644 is connected by lead 647 to buffer 650. The output of buffer 650 (FIG. 9d) is connected by lead 652 to an amplifier 654 whose output is connected by lead 656 to a power/divider matching newtork 658 (FIG. 9e). The power/divider matching network 658 is connected through lead 660 to a low-pass filter 662, by lead 664 to an amplifier 666, and by lead 668 to buffer 670 of a phase lock loop. Buffer 670 is connected by lead 672 to an amplifier 674 (FIG. 9f) which amplifies the buffered signals prior to connection by lead 676 to the 10/11 divide counter 678 (FIG. 9g).

The 10/11 divide counter 678 (FIG. 9g), which is, for example, a µA11C90, has PINS 2 and 3 connected by lead 680 to the output of a programmed prescaler controller 682 (FIG. 9f). The programmed prescaler 682 comprises a synchronous four bit counter 748, which may be, for example, an SN74LS161, whose input terminals (PINS 3, 4, 5, 6) are connected to the output of memory ROM IV (FIG. 7d) terminals 580, 578, 576, and 574; its load PIN 9 (FIG. 9g) is connected through lead 750 to reset gate 692 (FIG. 9h); and PIN 1 (FIG. 9f) is connected by lead 685 to +5 v DC source (FIG. 9h). The output PINS 11 and 13 of the synchronous four bit counter 748 (FIG. 9f) are connected to NAND gate 752 and its enable PINS 7 and 10 are connected to NAND gate 754. The output of NAND gate 752 is also connected to an input of NAND gate 754 whose output is connected through lead 680 to PINS 2 and 3 of the 10/11 divider 678.

The output of the 10/11 divider 678 (FIG. 9g) communicates the number of times the programmable divider should divide the incoming frequency by 10 and 11 to provide the desired 25 KHz frequency. The output of the 10/11 divider 678 is connected by lead 684 to the clock terminals (2 PINS) of synchronous four bit counters 748, 756, 758, and 760 of the programmable divider 686 (FIGS. 9f and 9h).

The synchronous four bit counters are, for example SN74LS161's. The input terminals (PINS 3, 4, 5, 6) of counters 756 and 758 are connected, respectively, to memory ROM (FIG. 7d) terminals 572, 570, 568, and 566 and to memory ROM II terminals 564, 562, and 560. The terminals 560, 562, 564, 566, 568, 570, 572, 574, 576, 578, and 580 are the synthesizer address terminals. Of these terminals, terminals 560 through 572 provide the function frequency address to the programmable divider. The 9 PINS of the counters 756, 758, and 760 are connected by lead 750 to the reset gate 692 and the ripple carry output PINS 15 of counter 756 and 758 are connected, respectively, by leads 762 and 764 to the enable PINS 10 and 7 of counter 760. The output of the programmable divider 686 (PIN 12 of counter 760) is connected by lead 688 to the phase detector (PIN 1) 690 (FIG. 9i) and input terminals of the reset gate 692 (FIG. 9h).

The phase detector 690 (FIG. 9i) may be, for example, a Motorola MC 4044, whose other input terminal (PIN 3) is connected by lead 694 to the 25 KHz signal output of the divide by 128 divider 696 (FIG. 9b). The divide by 128 divider 696 may be, for example, a dual four bit decode and bindary counter SN74LS393 whose input terminal (PIN 1) is connected by lead 698 to the buffered output of buffer 700. The buffer 700 is connected by lead 702 to the reference oscillator 704 (FIG. 9a). Reference oscillator 704 is a standard 3.2 MHz crystal oscillator.

The output of the phase detector 690 (FIG. 9i) (PINS 2 and 13) is connected through leads 710 and 768 to phase lock bit producer 708 and loop filter 648. The phase lock bit producer 708 includes diode switches connected to leads 710 and 768 of the phase detector. The diode output is amplified and connected by lead 712 to a NOR gate 770 and to the phase lock terminal of NOR gate 772 (FIG. 9g) of the transmit inhibit switch 714. The output of NOR gate 770 (FIG. 9i) is to the phase lock loss indicator terminal 592 (FIG. 7f). The loop filter 648 (FIG. 9i) includes a difference amplifier 774 whose plus and minus terminals are connected to the output leads 768 and 710 of the phase detector 690. The difference amplifier 774 provides a lead 646 either a zero voltage when the frequency of the incoming signal matches the reference frequency or a d.c. correction voltage through a tuned circuit (FIG. 9c), including a hyper abrupt diode 641 to the VCO 644 (FIGS. 9c and 9d) to complete the phase lock feedback loop. The corrected frequency signal is then buffered in buffer 650 (FIG. 9d), amplified in amplifier of the LO driver, passed through the power divider matching network 658 (FIG. 9e), filtered in low-pass filter 662 and provided as a local oscillator signal at receiver terminal 720 and through lead 664 to amplifier 666. The receiver output of the VHF synthesizer/receiver is between about 166.975 to 173.975 MHz.

The operation of amplifier 666 (FIG. 9e) is controlled by the transmit inhibit switch 714 (FIG. 9g). The transmit inhibit switch may be, for example, a two input positive NOR gate 772 having one input, as previously mentioned, connected to the phase lock bit producer 708 and its other input connected by lead 560 to the transmit receive indicator signal of ROM II (FIG. 7d). The output of NOR gate 722 (FIG. 9i) is connected by lead 776 to an inverter 778 (FIG. 9g). The output of inverter 778 is connected through lead 716 to a transistor switch 780 (FIG. 9e). The output transistor switch 780 is connected by lead 717 to amplifier 666 and controls the operation of amplifier 666 by inhibiting its operation during receive operation and enabling its operation during transmit. Amplifier 666 has its output connected to transmit terminal 718 and provides a transmit frequency range of 156.025–157.425 MHz.

POWER SUPPLY

The power supply (FIG. 10) is a part of the digital input/output printed wiring board 24. Terminal 64 is connected to a +13.75 v d.c. power source, which may be, for example, a standard battery. The d.c. voltage is filtered to remove any a.c. interference and applied to a voltage regulator 880. The voltage regulator 880, which may be, for example a 78L05, has its outputs connected to a difference amplifier 882, which acts as an oscillator, and to comparators 884 and 886. Comparators 884 and 886 compare, respectively, the output of the voltage regulator to the 5 v and 180 v outputs. The output of comparator 886 is amplified and filtered to provide the 5 v d.c. output at terminal 70. While the output of comarator 884, together with the oscillator 882 output, is applied to summing amplifier 888. The a.c. output is amplified and applied to the primary of a transformer 890. The output of the secondary of transformer 890 is rectified by rectifier 892 to provide the 180 v d.c. at terminal 72.

RECEIVER

Referring now to FIGS. 11a–11d, the receiver of the receiver/synthesizer board 26 includes a preselector 782 (FIG. 11a) connected by lead 784 to the receiver side of a duplexer switch 786. The duplexer switch is connected to an antenna (not shown) and permits use of the antenna during either receiver or transmitter operation. The preselector 782 is connected by lead 790 to a preamplifier 792. The preselector and preamplifier constitute a tuned RF amplifier stage which increases the selectivity and sensitivity of the receiver.

The output of the preamplifier 792 is connected by lead 794 to a first mixer 796. The first mixer 796 is also connected by lead 798 to a local oscillator filter 800 whose input is connected to terminal 720 of the synthesizer (FIG. 9b). The synthesizer acts as the local oscillator for the first mixer stage 796. The incoming frequency is mixed with that of the synthesizer in the first mixer 796 and the sum frequency (10.7 MHz) is connected by lead 802 to the first intermediate frequency (IF) amplifier 804. The IF amplifier which may be, for example, an SD6000, is permanently tuned to the constant sum frequency output of the mixer.

Figure 11A:
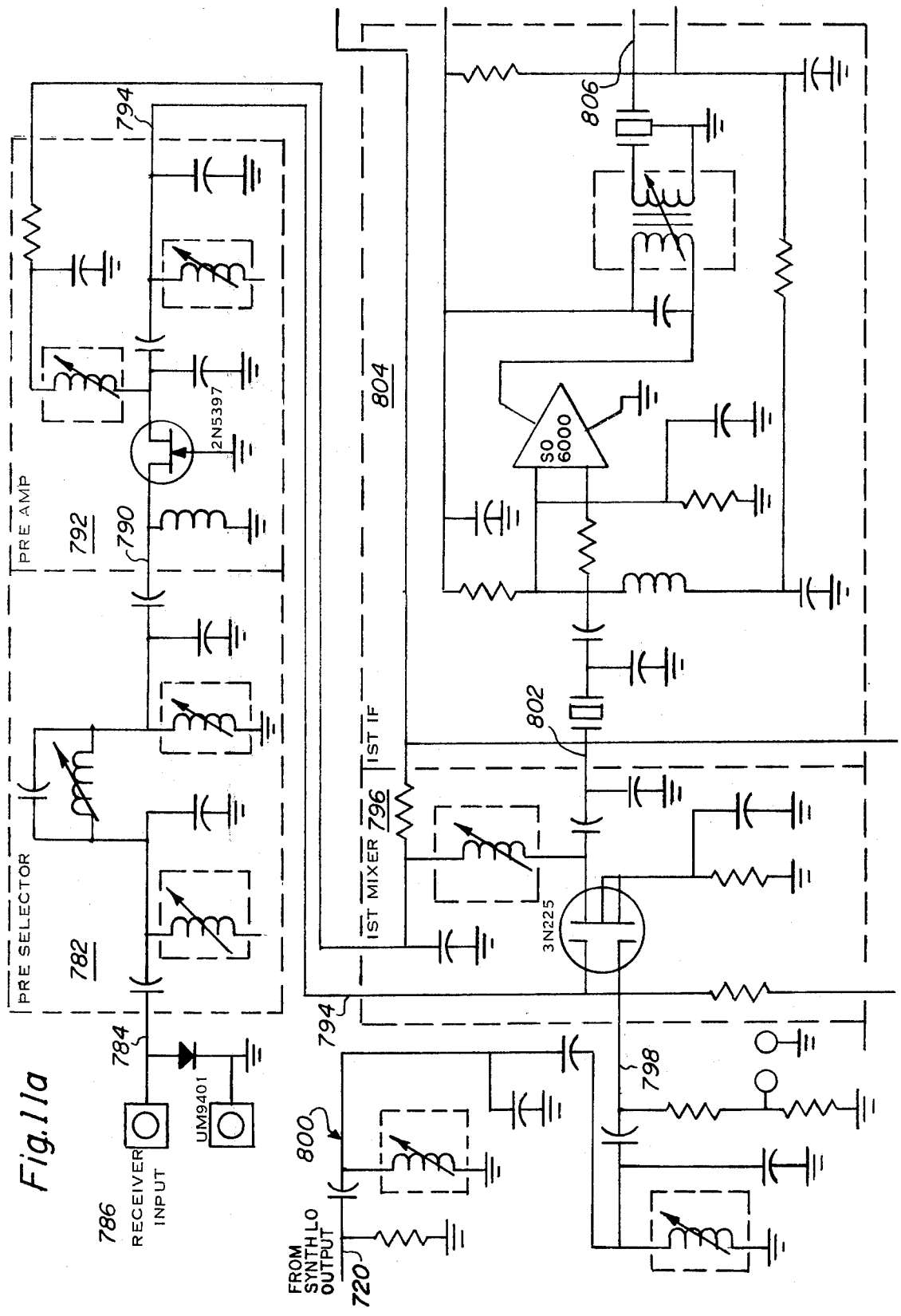
FIGS. 11a–11d are schematics of the receiver printed wiring board.
Figure 11B:
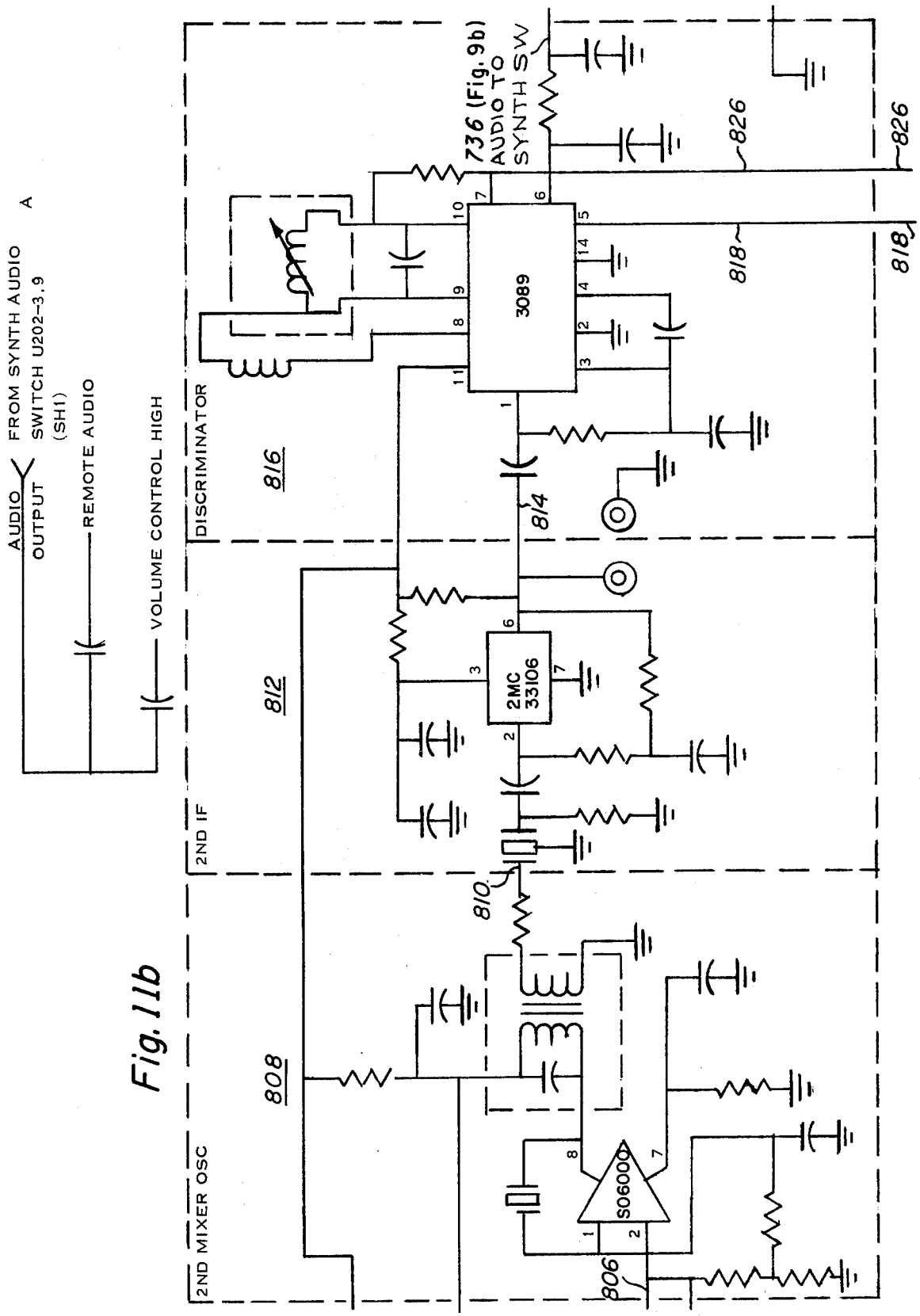
Figure 11C:
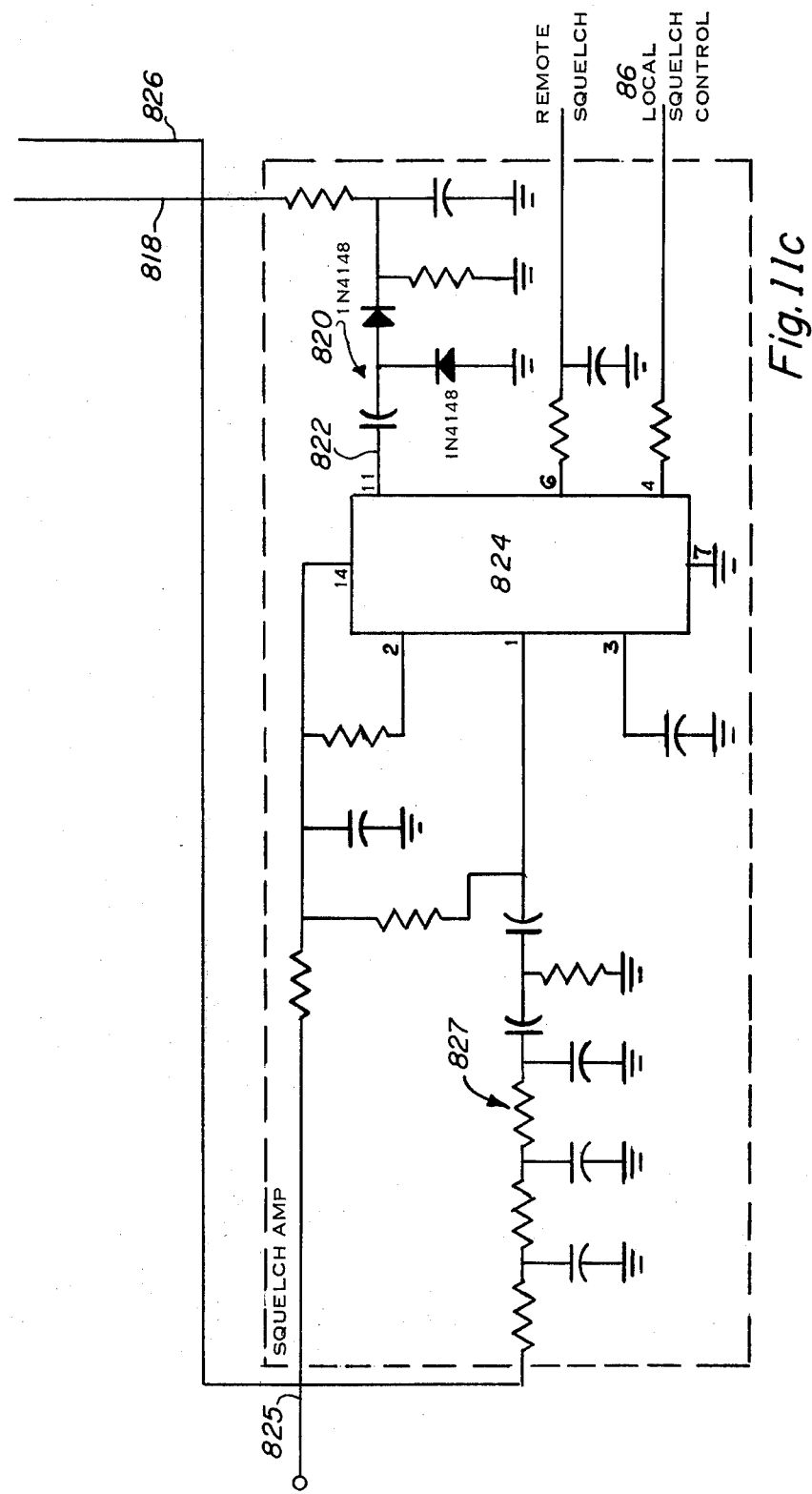

The IF amplifier 804 is connected by lead 806 to a second mixer oscillator 808 (FIG. 11b). The second mixer oscillator which is, for example, an SD 6000, is tuned to 10.245 MHz to produce a 455 KHz signal at its output. The second mixer 808 is connected by lead 810 to the second IF amplifier 812. The second IF amplifier is, for example, a 2MC33106 tuned to the 455 KH signal. The second IF amplifier is connected by lead 814 to a discriminator 816.

The discriminator which is, for example, a 3089, has its PIN 5 connected by lead 818 to the output of a squelch amplifier detector 820. The squelch amplifier detector (FIG. 11c) is connected by lead 822 to the squelch amplifier 824 (PIN 11). Squelch amplifier 824 is, for example, an LM 370 N whose input PINS 1 and 4 are connected, respectively, to a filter 827 and squelch control terminal 86. The filter 827 is connected by lead 826 to the output (PIN 7) of the discriminator 816 (FIG. 11b). The audio signal and any noise is fed to filter 827 (FIG. 11c) which passes the noise signal to amplifier 824. PIN 14 of the squelch amplifier 824 is connected through lead 825 to receiver power control terminal 834 (FIG. 4a). As the squelch control is advanced from the off position, an increasing positive voltage is applied through (PIN 4) of the squelch amplifier 824 and a squelch voltage is applied through the detector 820 and lead 818 to the discriminator (PIN 5) 816. As the squelch voltage is increased the RF energy is decreased to reduce the noise. This arrangement provides a very sensitive squelch control.

Figure 11D:
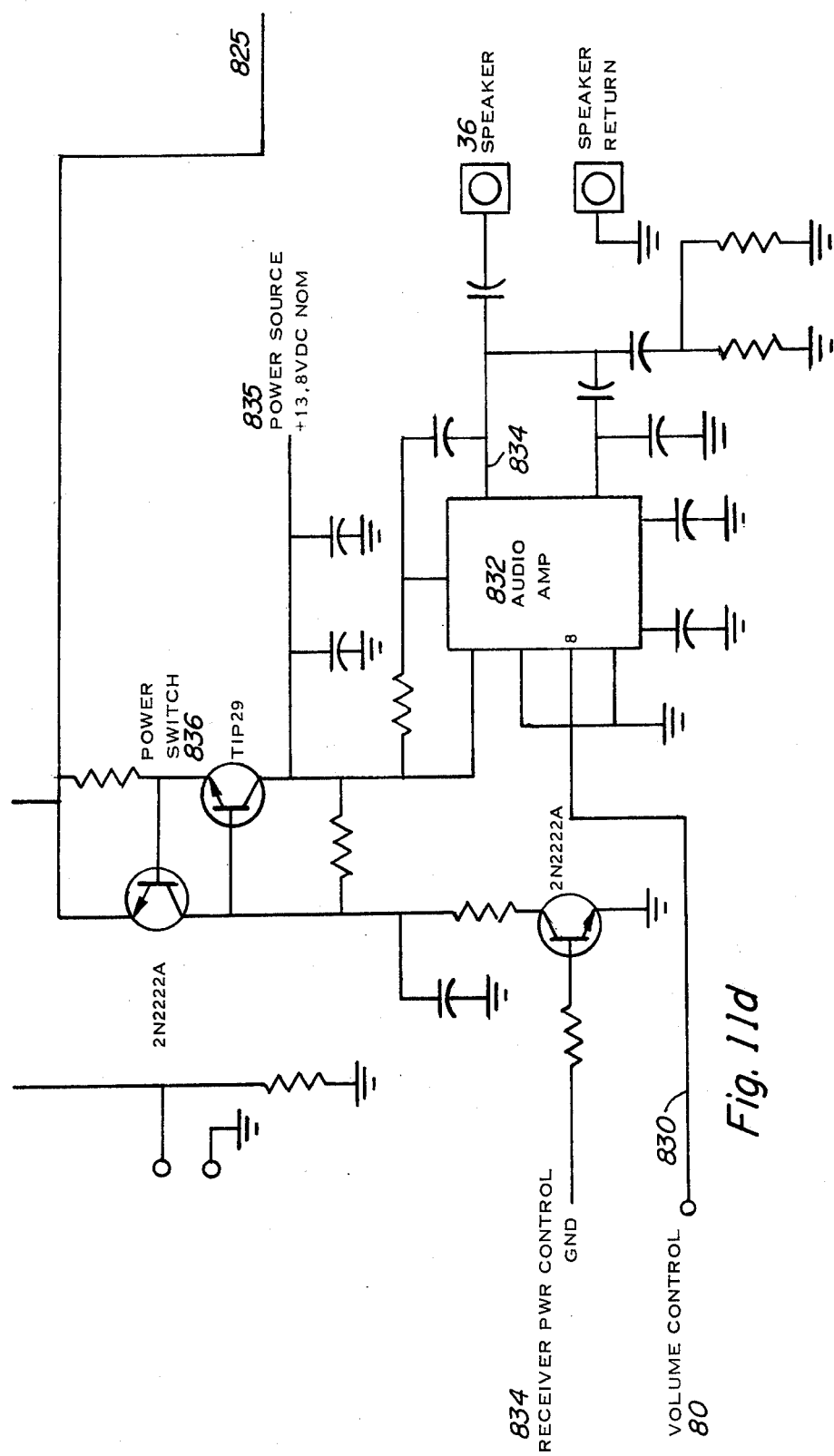

The output of the discriminator (PIN 6) (FIG. 9b) is to the synthesizer audio swtich 634 through lead 736 and from the switch 636 to the volume control terminal 80 (FIG. 11d). The volume control terminal 80 is connected by lead 830 to PIN 8 of audio amplifier 832 (FIG. 11d). The audio amplifier 832 output is connected by lead 834 to speaker 35. Power for the receiver is from the +13.8 power supply terminal 835 connected to a power switch 836.

TRANSMITTER

Figure 12A:
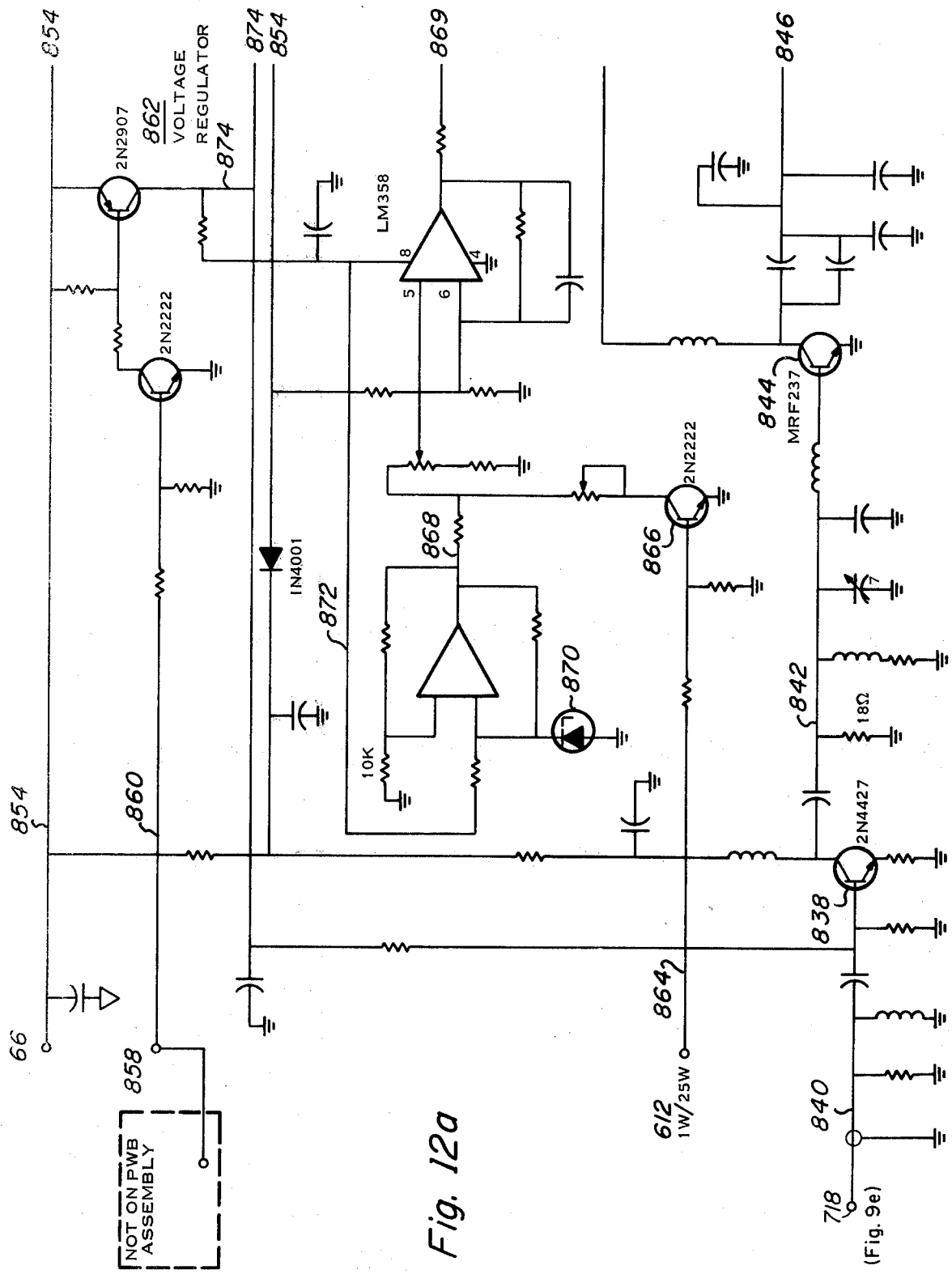
FIGS. 12a and 12b are schematics of the transmitter printed wiring board.
Figure 12B:
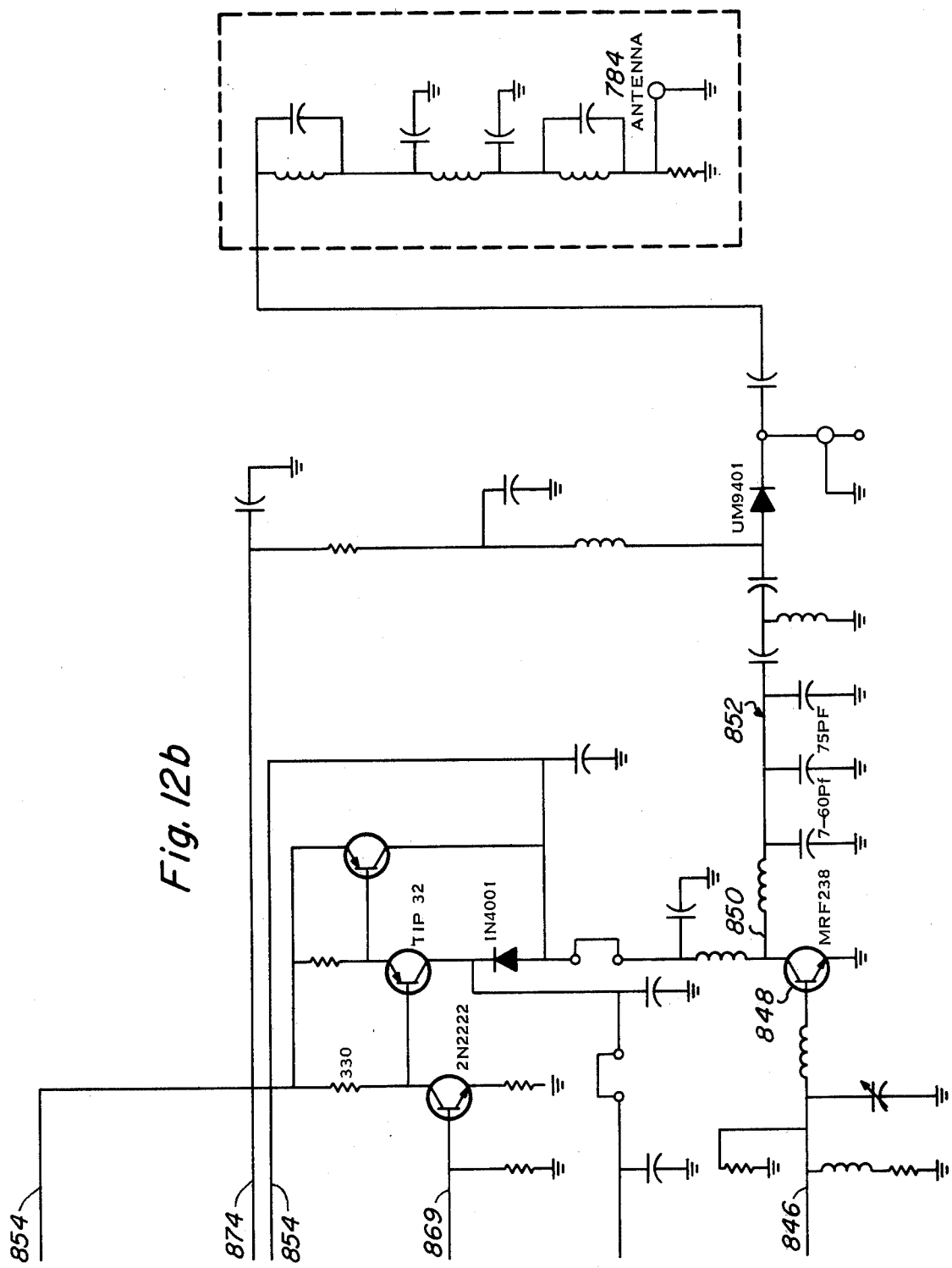

Referring now to FIGS. 12a and 12b, the transmitter PWB comprises an RF drive channel which includes a buffer amplifier 838 (FIG. 12a) connected by lead 840 to transmit terminal 718 (FIG. 9e). The buffer enhances the modulated RF modulated signal of the synthesizer. The buffer amplifier is connected by lead 842 to a drive amplifier 844, and the driver amplifier is connected by lead 846 to a tuned power amplifier 848 (FIG. 12b). The power amplifier output is connected by lead 850 through a low pass filter 852 to the receiver coaxial cable terminal 784 (FIG. 11a). Power is supplied the transmitter through the +13.75 v d.c. terminal 66 (FIG. 12a). The power is connected by lead 854 to a power regulator 862 and the output of the power regulator is connected by lead 874 to the RF drive channel.

The power regulator is controlled by the transmit/receive signal from terminal 858 connected by lead 860 to a transistor switch of the power regulator 862. The switch controls the output of the power regulator to disable the transmitter during operation of the receiver. The high/low power control 612 (FIG. 12a) is connected by lead 864 to power switch 866. Power switch 866 is connected by lead 869 to the voltage regulator 862 (FIG. 2b) for switching the transmitter between 1 w and 25 w power. The power switch is connected by lead 868 to a zener diode 870 which is connected by lead 872 to the power regulator 862. The zener diode operates to control power surges.

A coaxial cable interconnects terminal 874 to a duplexer switch connected to the antenna. The RF signals are transmitted by antenna (FIG. 12b) 788.

OPERATION

In operation, the 25 w/1 w/PA switch 42 (FIG. 5a) and the U.S.A./ITU select switch 44 are set for the desired operation. The on/off/volume control knob 38 is turned clockwise passed the "on" position to activate the set at a desired audio volume and the squelch knob 40 is adjusted to eliminate receiver background noise in the absence of a received signal.

When the unit is turned on, the display 46 will show channel 16 and a 512 Hz clock 334 (FIG. 6) begins to clock the four bit counter 346 to produce a binary digit word for multiplexers I and II of the keyboard detector 290 for channel selection detection. A channel is selected by pressing the keys-first for the tens digit and then the units digit. The multiplexers scan each key of the keyboard and produce a logic 0 at the binary count a pressed key is detected. The logic 0 of the keyboard detector is applied to flip-flop I of the load control 294 and to one input of the count hold NAND gate 383 (FIG. 7b).

The Q terminal of flip-flop I (FIG. 7b), in response in the logic 0 of the keyboard detector 290, produces a logic 0 which is applied to flip-flop II of the load control 294 and second terminal of the count hold NAND gate 383. NAND gate 383 produces a logic 1 which is inverted to a logic 0 by inverter 388 which disables the four bit counter 346 to hold the binary count representing the digit of the pressed key therein for subsequent input to the tens or units data registers as appropriate. The $\overline{Q}$ of flip-flop I produces a logic 1 when Q goes low; the logic 1 is applied to the preset terminal of flip-flop II to change its state, and to one input of a NAND gate 380 of the return to channel "16 C" circuit.

With a logic 0 applied to flip-flop II of load control 294, a logic 0 is produced at its Q channel and a logic 1 at its $\overline{Q}$ terminal. The logic 0 is applied to one terminal of NAND gate 398 of the unfinished channel selector circuit (FIG. 7c), and the logic 1 is applied to the clock terminal of flip-flop III (FIG. 7b), and to input terminals of NAND gates 392 and 394, respectively, of the units and tens load control circuits.

Flip-flop III of the load control 294 has its enable terminal connected to the output of NAND gate 402 to assure input to the tens register when the set is turned on. The $\overline{Q}$ output of flip-flop III produces a logic 1 in response to the logic 1 applied to its clock terminal; this logic 1 is applied to: another input terminal of NAND gate 394, the enable terminals of ROMS I, II, III, and IV of memory 320 (FIGS. 7d and 7e), synthesizer enable terminal 408 (FIGS. 7e, 7f, and 9h), OR gate 406 (FIG. 7e) of the units blanking circuit, a second terminal of NAND gate 398 (FIG. 7c) and input terminal of flip-flop III (FIG. 7b). The logic 1 input to the units blanking NOR gate 406 (FIG. 7e) enables the circuit to blank the units display and the logic 1 feedback input to flip-flop III (FIG. 7b) changes its state. The logic 0 of the Q terminal of flip-flop III is applied to NAND gate 392 to disable the units load control circuit. The remaining input terminals of NAND gates 392 and 394 have logic 1 inputs applied thereto by NAND gate 380 of the channel "16 C" return circuit until the channel "16 C" key is pressed. When the channel "16 C" key is pressed logic 1 signals are applied to disable NAND gates 392 and 394 to permit acquisition and display of channel "16" as will be described hereinafter.

With NAND gate 394 of the tens register load circuit enabled, a logic 0 is produced by NAND gate 394 and applied to the clear terminal of the "16 C" channel control flip-flop 456 (FIG. 7c) to clear it, and to an input terminal of NAND gate 428. The other input of NAND gate 428 is connected to the Q of flip-flop 422 (FIG. 7b) of the invalid channel selector circuit. A logic 0 from flip-flop 422 indicates a valid channel selection and NAND gate 428 (FIG. 7c) produces a logic 0 to enable the tens register 298 to receive the four bit data word from the four-bit counter 346 (FIG. 7d).

During this time NAND gate 392 has been disabled by the logic 0 output at the Q terminal of flip-flop III. However, when the logic 1 output of flip-flop III is received at its input, flip-flop III reverses its output to produce a logic 0 at its $\overline{Q}$ terminal to disable the NAND gate 394 of the tens register load circuit and to produce a logic 1 at its Q terminal to enable NAND gate 392 to produce a logic 0. The logic 0 output NAND gate 392 is inverted to a logic 1 by Inverter 416 (FIG. 7c) and applied to NOR gate 418. NOR gate 418 has its other input connected to the $\overline{Q}$ output of flip-flop 422 (FIG. 7b) of the illegal channel select circuit. NOR gate 418 (FIG. 7c) produces a logic 0 when inverter 416 produces a logic 1 and this logic 0 enables the units register 392 to receive the four bit binary word of four bit counter 346 (FIG. 7b) when the key for a unit has been pressed and detected by the keyboard detector.

When the channel "16 C" key is pressed and detected by the keyboard detector the binary number 1111 is on lines 364, 366, 368, and 370 and logic 1's are applied to the return to channel "16 C" NAND gate 380; in response thereto, a logic 0 is produced which disables the tens and units load control circuits. The logic 0 is applied to inverter 412 where it is inverted to a logic 1 and applied: to NAND gate 398 (FIG. 7c) of the unfinished channel detector circuit, to an input terminal of NAND gate 459 (FIG. 7b), and to the clock terminal of the channel "16 C" control flip-flop 456 (FIG. 7c). The Q terminal of flip-flop 456 then goes to a logic 1 which is applied to the tens data selector switch 450 and the units data selector switch 452 to switch them to receive four bit binary code words for channel "16". The binary code words for channel 16 are hard wired into the system. The flip-flop 456 is powered through lead 460 to AND gate 462 (FIGS. 7b and 7a) which has one input connected to power and another input connected to the microphone hook terminal 406. AND gate 462 (FIG. 7a) produces a logic 0 for flip-flop 456 (FIG. 7c) while power is on.

NAND gate 398 of the unfinished channel selector circuit, as previously mentioned, has its inputs connected to the inverted output of the return to "16 C" channel NAND gate 380 (FIG. fb) and to the Q and $\overline{Q}$ terminal outputs of flip-flops II and III of load control 294. Flip-flop I is clocked at a slower rate (64 Hz) than is flip-flop II (512 Hz). Thus, flip-flop II will remain on at least until after one more clock pulse is received by it. When flip-flop I produces a logic 1 applied to NAND gate 380 which together with the logic 1's received when the "16 C" key is pushed causes NAND gate 380 to produce a logic 0 to disable NAND gates 392 and 394 of the tens and units load circuits and to provide the logic one to NAND gate 398. With flip-flop II receiving a logic 1 from flip-flop I, flip-flop II produces a logic 1 for NAND gate 396 for at least one more count, and flip-flop III, if an unfinished channel exists, is providing a logic 1 at its $\overline{Q}$ terminal to NAND gate 398. NAND gate 398 having logic 1's at its inputs produces a logic 0 which is applied to the clear terminals of the ten's and units registers 450 and 452 to clear these registers.

Thus, if the operator has finished using another channel the "16 C" key can be pressed to return to channel "16". Also, by pressing the "16 C" key again the set will be tuned to the channel selected immediately prior to returning to channel 16. Further, if the preceeding channel selection was not completed or if a mistake has been made, the channel registers are cleared by pushing the "16 C" key.

Assuming the ten's and unit's registers have been enabled to receive the ten's and unit's binary numbers and the return channel "16 C" control has not been activated, the binary numbers for the selected channel pass through the ten's and unit's data selectors 450 and 452 (FIG. 7c) on lines 468, 478, 482, and 488; and lines 502, 506, 510, and 516 to the illegal channel detector 322 (FIG. 7f), which includes an illegal transmit channel data and an improper weather channel detector.

The illegal channel selector is a plurality of logic gates connected to the ten's selector switch 450 as previously described. For example, if the illegal channel "53" is selected, the binary number 0101 appears, respectively, on lines 488, 482, 478, and 468. The 0 (from left to right) signal is applied to NAND gates 470 and 486, the 1 is applied to inverter 484 and to a second terminal of NAND gate 486, the 0 is applied to the inverter 480 and second terminal of NAND gate 482, and the 1 is applied to the second terminal of NAND gate 470 and to inverter 472. The inverted output (1) of inverter 480 is applied to third terminals of NAND gates 470 and 486. Thus, NAND gate 470 has a 1,1,0 load and goes to a 1; NAND gate 486 has a 0,1,1 load and goes to 1. The inverted outputs (0's) of inverters 472 and 484 are applied to NAND gate 482 which now has a 0,0,0 load and goes to a 1. The logic 1's of gates 470, 482, and 486 are applied to NAND gate 490 which goes to a logic 0; the logic 0 is applied as an illegal channel signal to one input of OR gate 494. The other input of OR gate 494 is connected to the output of the improper weather channel.

The improper weather channel which has AND gate 474 connected to lines 478 and 468 of the ten's selector switch and the plurality of logic elements connected to lines 510, 516, 506 and 502 of the units selector switch 452 receives, for example, a 0 from line 478 and a 1 from line 468 and produces a logic 0 which is applied to one terminal of AND gate 498 and to a NOR gate 500 (FIG. 7e) of the ten's blanking circuit. The unit selector lines 516, 510, 506 and 502 (FIG. 7f) have, respectively, the binary three, 0011, digit of our example of which the 0's of lines 516 and 510 are applied, respectively, to OR gate 512 and NOR gate 514, and the 1's of lines 506 and 502 are applied to NOR gate 504. The 1 of line 506 is also applied to one terminal of NAND gate 508. The 0's on the OR gate 512 produce a 0 on AND gate 518, and the ones on NOR gate 504 produce a 0 on AND gate 518. The 0's on NOR gate 514 produce a 1 on another terminal of AND gate 508 and NAND gate 508 produces a 1 on NOR gate 520. A 1 and 0 on NOR gate 520 produces a 0 on AND gate 498. With 0's present AND gate 498 produces a 0 which is applied to the other terminal of OR gate 494.

OR gate 494 then produces a 0 which is applied to the other terminal of NAND gate 522 (FIG. 7e). When NAND gate 522 receives also a 0 from the Q terminal of flip-flop III (FIG. 7b), which disables the unit's register 302, NAND gate 522 produces a 1 which is applied through conductor 524 to flip-flop 422. With a 1, flip-flop 422 produces a 1 at its Q terminal and a 0 at its $\overline{Q}$ terminal. The $\overline{Q}$'s 0 is applied to circuit breakers 372, 374, 376, and 378 of the "99's" input to load lines 370, 368, 366, and 364 with 1's and the Q's 1 is applied to circuit breakers $\overline{G1}$ and $\overline{G2}$ to disable lines 368 and 366 to produce a binary 9 on leads 364, 366, 368, and 370 which are applied to the ten's and unit's data registers 298 and 302 (FIG. 7c) and a "99" is displayed to indicate the illegal or nonassigned channel. To make the "99" flash on and off, the Q output of flip-flop 422 (FIG. 7b) is applied to the reset terminal of flip-flop 358 which has its clear terminal connected to the 2 Hz output of divider 348 (FIG. 7a) and the $\overline{Q}$ output is applied through inverter 536 (FIG. 7b) to terminals of NOR gates 406 and 500 (FIG. 7e) to alternately excite the ten's and unit's display blanking circuits.

When a legal channel such as, for example, "68" is selected the output of the ten's selector (FIG. 7c), which is 0110, and the output of the unit's selector which is 1000 are applied to the ROM memory, and to the display for displaying a "68". PIN 15 of ROMS II, III, and IV (FIG. 7d) are connected by lead 556 to the output of a transmit/receive indicating AND gate 558 (FIG. 7f). AND gate 558 has its input connected to the select PA output and the push-to-talk switch. The output of ROM III, PIN 9, (FIG. 7d) is used also to provide a receive only indicator signal which is connected by lead 582 to NAND gate 584 (FIG. 7f). NAND gate 584 must receive logic "1's" from the select PA switch, microphone hook switch, receive only terminal, and push-to-talk switch to operate the system in the transmit mode. The phase lock-loss signal is also applied to NOR gate 362 (FIG. 7e) and a lock-loss signal is applied to the ten's decimal display which flashes on and off to indicate the synthesizer has lost phase-lock.

The weather channels do not have a two digit number to identify them. They are identified as WX-1, WX-2, and WX-3 and are selected by pressing the "SEL" key and then 1 or 2 or 3 as desired. The display will show the digit and the unit's digit decimal point will be flashing on and off. This indicates the selected channel is a receive only channel.

The output of the memory 320 (FIG. 7d) is a binary number representing the frequency of the selected channel. The output of lead 560 indicates whether the unit is in the transmit or receive mode. The synthesizer address signal instructs the programmable divider 686 (FIGS. 9h and 9f) to divide the output signal by the appropriate division to provide a signal ±25 KHz which is compared with the 25 KHz signal of the reference in the phase detector 690 (FIG. 9i) and the difference applied to the VCO to correct the output frequency.

During transmit the audio switch 634 (FIG. 9b) is open and the amplifier 748 (FIG. 9c) of the modulator driver 640 voltage goes low and is held low. Thus, the modulator diode has no influence on the loop diode. However, when the microphone push-to-talk (audio) switch is closed the gain of amplifier 748 increases to effectively modulate the output frequency.

The output of the synthesizer in the receive mode is connected to terminal 720 leading to the first mixer 796 (FIG. 11a) of the receiver as the local oscillator signal; the output of the synthesizer in the transmit mode is the modulated signal connected to terminal 718 (FIG. 12a) of the transmitter for transmission.

Although only one embodiment of the invention has been described herein, it will be apparent to a person skilled in the art that various modifications to the details of construction shown and described may be made without departing from the scope of this invention.

What is claimed is:
1. A radio telephone comprising:
   (a) a keyboard channel selector including a plurality of switch circuits including a switch circuit for each of the digits "0" through "9", the digit switch circuits each having a numbered pressable key switch for producing a binary logic indicating signal whereby a channel is selected by sequentially pressing keys for the ten digit and unit digit;
   (b) a counter means for producing a binary coded count;
   (c) a digital keyboard detector connected to the counter means for receiving the binary coded count and to the keyboard for scanning the keyboard circuits to detect a pressed key and generating a pressed key indicating signal stopping the counter means to hold the count representing the pressed key for a channel selection;

(d) a load control means connected to the digital keyboard detector for receiving the pressed key indicating signal and producing alternating load signals;

(e) a tens register and a units register connected to the load control and counter means, the tens and units registers operatively responsive to the load signals of the load control means to store the binary coded count sequentially into the tens and units registers;

(f) a memory connected to the tens and units registers for receiving the binary coded numbers of the tens and units registers and producing a corresponding synthesizer address code;

(g) a synthesizer connected to the memory for receiving the synthesizer address code and producing the frequency of the selected channel;

(h) an electroacoustic transducer selectively connected to the synthesizer for modulating the channel selection frequency:

(i) a receiver having a heterodyning stage connected to the synthesizer for selectively receiving the channel selection frequency as a local oscillator frequency, and producing audio frequency electric power; and (j) a transmitter alternatively connected to the synthesizer for transmitting a modulated radio frequency signal over the selected channel.

2. A radio telephone according to claim 1 further including a tens and units data selector connected to the tens and units registers and hardwired to a binary coded word for an emergency channel, an emergency station control means connected to the load control, and an emergency channel key connected to the keyboard detector whereby the emergency channel is selected by the tens and units data selector responsive to pressing the emergency channel key a first time and the previously selected channel is selected responsive to pressing the emergency channel key a second time.

3. A radio telephone according to claim 2 further including a select key switch in a circuit connected to the keyboard channel detector for producing a tens blanking signal for the tens register whereby the tens register output may be blanked for the selection of a weather channel.

4. A radio telephone according to claim 3 further including a display means connected to the output of the tens and units data selector for displaying the number of the channel selected.

5. A radio telephone according to claim 4 further including a nonassigned channel detector means connected to the tens and units data selectors for detecting the selection of a nonassigned channel, the nonassigned channel detector means including a nonassigned channel binary coded number means connected to the tens and data registers for producing the nonassigned channel number when a nonassigned channel is selected for display by the display means, and a flashing on and off circuit connected to the nonassigned channel detector means and display for intermittingly interrupting the display of the nonassigned channel number.

6. A radio telephone according to claim 5 further including an improper weather channel detector means connected to the output of the tens and units data selectors and the nonassigned channel binary coded number means for detecting and producing for display by the display means the number of the nonassigned channel binary coded number means.

7. A radio telephone according to claim 1 further including a signal processor means including a NAND gate having its input connected to receive operating signals from the front panel controls and a phase lock loss indicating signal from the synthesizer, and a power control gate connected to the output of the NAND gate, the power control gate operatively responsive to the NAND gate output to selectively control transmission.

8. A radio telephone according to claim 1 wherein the synthesizer includes a programmable divider connected to the coded frequency output of the memory for producing a desired signal frequency, a reference oscillator for producing a reference frequency signal, a phase detector for comparing the frequency signal of the programmable divider with the reference frequency signal, a resonant tuned circuit connected to the output of the phase detector for producing signals at the selected frequency, a first varactor diode connected to the output of the resonant tuned circuit, an audio circuit including a modulator driver for audio modulating the output of the resonant tuned circuit, a second varactor diode connected to the output of the modulator driver circuit, a VHF oscillator connected to the first and second varactors, said first and second varactor outputs operative to control the VHF oscillator to produce an unstable oscillator signal to accomodate a modulated signal for transmission by the transmitter and said modulation driver acting as a voltage follower to send the second varactor to a low voltage and hold it there in the absence of audio signals to control the VHF oscillator to produce a stable local oscillator signal for the receiver.

9. A radio telephone according to claim 1 wherein said receiver includes a squelch control circuit operatively connected to the discriminator of the receiver superheterodyne stage, said squelch control circuit comprises a filter means connected to the RF output of the discriminator, the filter means for passing a preselected noise frequency range, an amplifier connected to the filter for receiving the output of the filter, a squelch control means connected to the amplifier for controlling the gain of the amplifier, and a detector connected to the amplifier for detecting the noise frequency range, the detector connected to the discriminator for substantially reducing the noise level in response to the detector output.

* * * * *